(12) United States Patent
Mizuno

(10) Patent No.: US 8,115,507 B2
(45) Date of Patent: *Feb. 14, 2012

(54) CIRCUIT AND METHOD FOR PARALLEL TESTING AND SEMICONDUCTOR DEVICE

(75) Inventor: Masayuki Mizuno, Tokyo (JP)

(73) Assignee: NEC Corporation, Tokyo (JP)

( * ) Notice: Subject to any disclaimer, the term of this patent is extended or adjusted under 35 U.S.C. 154(b) by 288 days.

This patent is subject to a terminal disclaimer.

(21) Appl. No.: 12/514,363

(22) PCT Filed: Nov. 2, 2007

(86) PCT No.: PCT/JP2007/071400
§ 371 (c)(1),
(2), (4) Date: May 11, 2009

(87) PCT Pub. No.: WO2008/056609
PCT Pub. Date: May 15, 2008

(65) Prior Publication Data
US 2010/0052724 A1 Mar. 4, 2010

(30) Foreign Application Priority Data

Nov. 10, 2006 (JP) ................................. 2006-305074
Sep. 27, 2007 (JP) ................................. 2007-250584

(51) Int. Cl.
*G01R 31/02* (2006.01)
(52) U.S. Cl. .............................. 324/762.01; 324/762.06
(58) Field of Classification Search ............ 324/762.01–762.06; 714/726, 714/729, 731, 736
See application file for complete search history.

(56) References Cited

U.S. PATENT DOCUMENTS

| | | | |
|---|---|---|---|
| 4,875,003 A * | 10/1989 | Burke | 714/736 |
| 5,663,966 A | 9/1997 | Day et al. | |
| 5,936,976 A | 8/1999 | Story et al. | |
| 6,242,269 B1 * | 6/2001 | Whetsel | 438/11 |
| 6,456,102 B1 * | 9/2002 | Mori et al. | 324/750.01 |
| 6,653,855 B2 * | 11/2003 | Mori et al. | 324/756.07 |
| 6,717,429 B2 * | 4/2004 | Whetsel | 324/750.3 |
| 6,894,308 B2 * | 5/2005 | Whetsel et al. | 257/48 |

(Continued)

FOREIGN PATENT DOCUMENTS

JP 4-355383 A 12/1992

(Continued)

OTHER PUBLICATIONS

International Search Report for PCT/JP2007/071400 mailed Feb. 5, 2008.

(Continued)

*Primary Examiner* — Huy Q Phan
*Assistant Examiner* — Joshua Benitez

(57) ABSTRACT

Disclosed is a test circuit including a first transfer circuit, a second transfer circuit and comparators and performing parallel testing of a plurality of chips under test. The first transfer circuit includes flip-flops. A data pattern from a tester is supplied to the initial stage chip under test. To the remaining chips under test, output data from the corresponding stages of the first transfer circuit are supplied. The second transfer circuit sequentially transfers an output of the initial stage chip under test, as an expected value pattern, in response to clock cycles. The comparator compares output data of the chip under test with an expected value pattern from the corresponding stage of the second transfer circuit.

16 Claims, 18 Drawing Sheets

U.S. PATENT DOCUMENTS

2002/0175697 A1    11/2002    Miller et al.

FOREIGN PATENT DOCUMENTS

| JP | 1996050165 A | 2/1996 |
| JP | 10-111339 A | 4/1998 |
| JP | 2003016799 A | 1/2003 |
| JP | 2006319055 A | 11/2006 |

OTHER PUBLICATIONS

N. Miura, et al., "A 1 Tb/s 3W Inductive-Coupling Transceiver for 3D-Stacked Inter-Chip Clock and Data Link", IEEE Journal of Solid-State Circuits, vol. 42, No. 1, Jan. 2007, p. 111-122.

Supplementary European Search Report for EP 07 83 1134 completed May 13, 2011.

* cited by examiner

FOR N=4

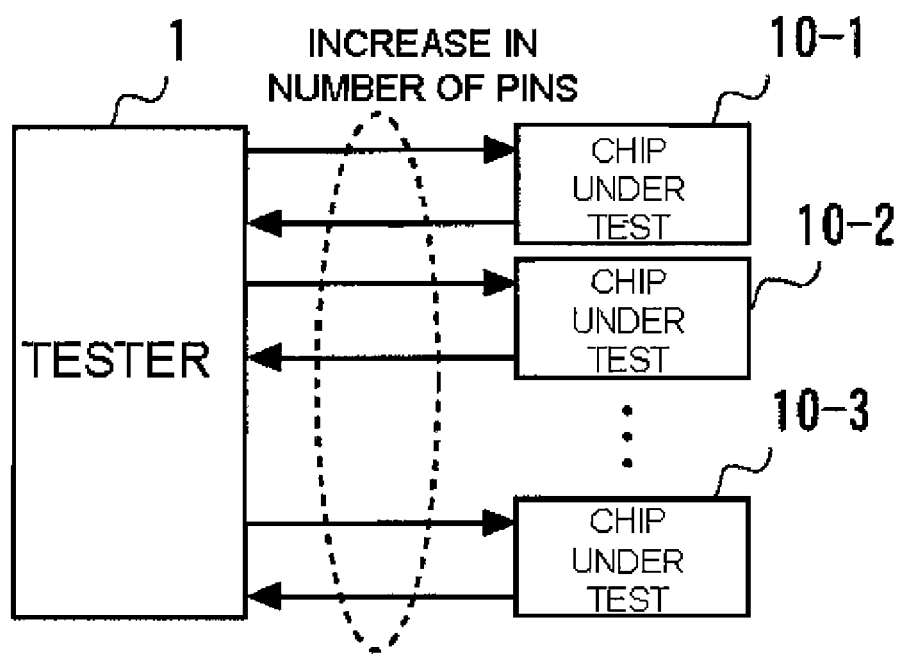

CIRCUIT AND METHOD FOR PARALLEL TESTING AND SEMICONDUCTOR DEVICE

This application is the National Phase of PCT/JP2007/071400, filed Nov. 2, 2007, which claims priority rights based on the Japanese Patent Application 2006-305074, filed in Japan on Nov. 10, 2006 and on the Japanese Patent Application 2007-250584, filed in Japan on Sep. 27, 2007. The total disclosure of these Patent Applications of the senior filing dates is to be incorporated herein by reference.

TECHNICAL FIELD

This invention relates to a circuit and a method for parallel testing, and a semiconductor device.

BACKGROUND ART

Recent device miniaturization (shrinkage of transistor dimensions) has caused a chip to be increased in size and density. This, in turn, has increased screening test time (wafer test at preprocess and a final test following packaging) and test cost to render it difficult to decrease a product cost. An increased chip size means an increased number of transistors and an increased number of combinations. An increased chip density means an increased number of transistors and an increased probability of defect per unit area. On the other hand, the physical phenomenon is becoming increasingly complex and the number of types of defect is also increasing.

To provide for shorter test time, the technique of parallel testing of chips under test (devices under test, also termed as DUTs), shown for example in FIG. 16, has so far been used. A plural number of input/output ports of a tester (Automatic Test Equipment) 1 are divided into a plurality of groups. The input/output ports mean a set of drivers and comparators, and are also termed I/O channels or I/O pins. The chips under test 10 are connected to the respective groups and a plurality of chips under test 10-1 to 10-3 are simultaneously tested in parallel on the tester 1. During functional testing, test patterns (force patterns) are supplied in parallel from respective different groups of drivers, not shown, and outputs of the chips under test 10-1 to 10-3 are compared in parallel with expected value patterns by comparators of each of the different groups, such as to give decisions on pass/fail.

As regards a BOST (Built Out Self Test), subsequently explained in Examples of the present invention, reference may be made to, for example, the disclosure of Patent Document 1. In Patent Document 1, there is disclosed an arrangement in which test chips BIST (Built In Self Test) and BOST are used to conduct a pattern dependent testing and timing-dependent testing.

Patent Document 1: JP Patent Kokai JP-A-2003-16799
Non-Patent Document 1: Miura, N,; Mizoguchi, D.; Inoue M.; Niitsu, K.; Nakagawa, Y. Tago, M.; Fukaishi M.; Sakurai, T.; Kuroda, T., "A 1 Tb/s 3W Inductive-Coupling Transceiver for 3D-Stacked Inter-Chip Clock and Data Link", Solid-State Circuits, IEEE Journal of, Volume 42, Issue 1, January 2007, Page(s): 111~122

SUMMARY

The total disclosure of the Patent Document 1 and Non-Patent Document 1 is incorporated herein by reference. The following analysis is given by the present invention.

If, in the arrangement shown in FIG. 16, the number of times of parallel testing is to be increased, the number of input/output ports must be increased. The restriction on the number of the input/output ports of the tester imposes restrictions on the number of times of parallel testing. For example, if, in a tester with 256 input/output ports (channels), a pattern vector of a data pattern applied to each chip under test is 64-bit wide, the upper limit of the number of parallel connections is 4. In actuality, there are cases where a DC signal is applied through a pin not controlled by the pattern vector via the input/output port (channel) of the tester. Thus, the number of parallel connections is lesser than 4.

It is therefore an object of the present invention to provide a circuit and a method for testing, according to which the number of input/output pins needed by a tester may be prohibited from increasing even if the number of parallel connections for parallel testing is increased.

The invention may be summarized as follows:

In one aspect, the present invention provides a parallel test circuit for testing a plurality of chips under test in parallel, in which the parallel test circuit comprises a first transfer circuit and a second transfer circuit. The first transfer circuit receives a data pattern to be applied to the chips under test from a preceding stage and that transfers the data pattern to a succeeding stage. The second transfer circuit receives an expected value pattern from a preceding stage to transfer the so received expected value pattern to the succeeding stage. An output of each of the chips under test is compared with a corresponding expected value pattern by a comparator provided in association with each of the chips under test.

In another aspect, the present invention provides a parallel test circuit comprising a first transfer circuit, a second transfer circuit and a comparator circuit. The first transfer circuit sequentially transfers a data pattern, supplied from a data pattern supply source, in response to a clock signal. The data pattern from the data pattern supply source is supplied to one of the chips under test, and a data pattern from a corresponding stage of the first transfer circuit is sequentially supplied to each of the remaining ones of the chips under test. The second transfer circuit sequentially transfers an output of the one chip under test, as an expected value pattern, in response to the clock signal. The comparator circuit is provided in association with each of the remaining chips under test and compares output data of each of the chips under test with the expected value pattern from corresponding stages of the second transfer circuit to determine whether or not the output data coincides with the expected value pattern. Thus, a plurality of chips under test may be tested in parallel by the sole data pattern supply source.

The parallel test circuit according to the present invention further comprises a clock distribution circuit that receives a clock signal from a clock supply source to supply the clock signal to the chips under test, the first transfer circuit and the second transfer circuit. The clock distribution circuit provides for uniform supply timings of the clock signal and the data pattern to the chips under test from one of the chips under test to another.

According to the present invention, the first transfer circuit may include a plurality of flip-flops connected in cascade, and the second transfer circuit may also include a plurality of flip-flops connected in cascade. The parallel test circuit may further comprise a plurality of clock buffers each of which receives the clock signal from the clock supply source. The chips under test, the flip-flop of each stage of the first transfer circuit and the flip-flop each stage of the second transfer circuit may be supplied with the clock signal output from the clock buffer of the corresponding stage.

According to the present invention, the data pattern supply source and the clock supply source may be comprised within a test equipment.

According to the present invention, the data pattern supply source and the clock supply source may be comprised within a BOST (Built On Self test) device.

According to the present invention, an output of the one chip under test may be supplied to the test equipment and compared with an expected value pattern in a comparator within the test equipment.

According to the present invention, the one chip under test may be a plurality of chips under test connected in parallel. A data pattern from the data pattern supply source and a clock signal from the clock supply source may be supplied in parallel to each of the chips under test connected in parallel. There may be provided a compare and select circuit that receives outputs of the chips under test connected in parallel and that gives a majority decision on the outputs to select output data. An output of the compare and select circuit may be transferred as the expected value pattern to the second transfer circuit.

According to the present invention, an output of the compare and select circuit may be supplied to the test equipment and compared with an expected value pattern by a comparator in the test equipment.

In another aspect of the present invention, there is provided a parallel test circuit comprising a first transfer circuit, a second transfer circuit, a comparator and one other comparator. The first transfer circuit sequentially transfers a data pattern, supplied from a data pattern supply source, in response to a clock signal, and the second transfer circuit sequentially transfers an expected value pattern from an expected value pattern supply source in response to the clock signal. The data pattern from the data pattern supply source is supplied to one of the chips under test, and a data pattern from a corresponding stage of the first transfer circuit is sequentially supplied to each of the remaining ones of the chips under test. The first one of the comparators compares whether or not output data of the one chip under test coincides with the expected value pattern from the expected value pattern supply source to determine whether or not the two coincide with each other. The other comparator is provided for each of the remaining chips under test and compares output data of each of the chips under test with an expected value pattern from a corresponding stage of the second transfer circuit to determine whether or not the two coincide with each other. A plurality of chips under test may thus be tested in parallel by a sole data pattern supply source and a sole expected value pattern supply source.

According to the present invention, the data pattern supply source, clock supply source and the expected value pattern supply source may be comprised within a test equipment, and the data pattern, the clock signal and the expected value pattern may all be supplied from the test equipment.

According to the present invention, the data pattern and the expected value pattern may respectively be transferred in parallel through the first transfer circuit and the second transfer circuit in parallel by a plurality of bits as a unit.

According to the present invention, the data pattern and the expected value pattern are serially transferred through the first and second transfer circuits, respectively. There may also be provided a circuit that converts the serial data pattern, serially transferred through the first transfer circuit, into a parallel data pattern of a preset bit width. The converting circuit is provided from one of the chips under test to another. There may also be provided a circuit that converts a serial expected value pattern, serially transferred through the second transfer circuit, into a parallel expected value pattern of a preset bit width. The converting circuit is provided from one of the chips under test to another. There may further be provided a set of a plurality of comparators and a logic circuit provided in association with each of the chips under test. Each of the comparators compares output data of each chip under test receiving the parallel data pattern with the corresponding parallel expected value pattern, bit-by-bit, such as to determine whether or not the output data and the parallel expected value pattern coincide with each other bit-by-bit. The logic circuit outputs fail in case at least one of the comparators indicates non-coincidence.

According to the present invention, the data pattern is serially transferred through the first transfer circuit and the expected value pattern is serially transferred through the second transfer circuit. There may be provided a circuit that converts the serial data pattern, serially transferred through the first transfer circuit, into a parallel data pattern of a preset bit width. The converting circuit is provided common to a preset plural number of the chips under test. There may also be provided a circuit that converts a serial expected value pattern, serially transferred through the second transfer circuit, into a parallel expected value pattern of a preset bit width. The converting circuit is provided common to a preset plural number of the chips under test. There may further be provided a set of a plurality of comparators and a logic circuit provided in association with each of the chips under test. Each of the comparators comparing output data of each chip under test may receive the parallel data pattern with the corresponding parallel expected value pattern bit-by-bit to determine whether or not the output data and the parallel expected value pattern coincide with each other bit-by-bit. The logic circuit outputs fail in case at least one of the comparators indicates non-coincidence. According to the present invention, there may further be provided a circuit that buffers an input clock signal to supply the signal buffered to the first and second transfer circuits. The circuit buffers a frequency divided input clock signal to convert the serial pattern and the serial expected value pattern into respective parallel data. There may further be provided a clock distribution circuit that delivers the clock to each of the chips under test.

In a further aspect, the present invention provides a parallel test circuit comprising a plurality of semiconductor devices connected in cascade. The semiconductor devices each include a first converter circuit, a second converter circuit, a plurality of comparators and a logic circuit. The first converter circuit outputs a serial input data pattern serially and converts the serially input data pattern into a parallel data pattern. The second converter circuit serially outputs a serially input expected value pattern and converts the serially input expected value pattern into a parallel expected value pattern. The input clock signal is buffered by a clock buffer and distributed to each clock supply destination. The chips or devices under test each input the parallel data pattern from the first converter circuit. The comparators compare output data of the chips or circuits under test to the parallel expected value pattern from the second converter circuit bit-by-bit to determine whether or not the output data and the expected value pattern coincide with each other bit-by-bit. The logic circuit outputs fail in case at least one of the comparators indicates non-coincidence. A data pattern, an expected value pattern and a clock signal regarding an initial stage semiconductor device are supplied from a test equipment. The data pattern, the expected value pattern and the clock signal regarding the second and the following semiconductor devices are the data pattern, the expected value pattern and the clock signal supplied from the semiconductor devices directly preceding to the second and the following semiconductor devices.

In a further aspect, the present invention provides a semiconductor device comprising a first converter circuit, a second converter circuit, a plurality of comparators and logic circuit. The first converter circuit serially outputs a serially input data pattern and converts the serially input data pattern into a parallel data pattern. The second converter circuit serially outputs a serially input expected value pattern and converts the serially input expected value pattern into a parallel expected value pattern. The input clock signal is buffered by a clock buffer and distributed to each clock supply destination. The chips or devices under test each input a parallel data pattern from the first converter circuit. The comparators compare output data of the chips or circuits under test and a parallel expected value pattern from the second converter circuit bit-by-bit to determine whether or not the output data and the expected value pattern coincide with each other bit-by-bit. The logic circuit outputs fail in case at least one of the comparators indicates non-coincidence;

In a further aspect, the present invention provides a test circuit on a semiconductor wafer in which one semiconductor device on a semiconductor wafer has a signal path that transfers a data pattern, an expected value pattern and a clock signal to one or more other semiconductor devices neighboring to the one semiconductor device with respect to at least one of one to four sides of the one semiconductor device. The test circuit includes a selector that selects one signal path corresponding to one of one to four sides of the one semiconductor device and that inputs a set of a data pattern, an expected value pattern and a clock signal from the signal path corresponding to the selected direction. The test circuit also includes a selected data transfer circuit that compares the data pattern selected by the selector output data of the chip under test with an expected value pattern received. The output data is data obtained as a result of operation of the chip under test that has received a data pattern as selected by the selector and a clock signal. The selected data transfer circuit outputs the data pattern, clock signal and the expected value pattern to at least one of one to four sides of the neighboring semiconductor devices.

A data pattern, a clock signal and an expected value pattern are supplied to the one semiconductor device on the semiconductor wafer. The data pattern, the clock signal and the expected value pattern are sequentially transferred from the semiconductor device or devices neighboring to the one semiconductor device to other peripheral semiconductor devices.

In a further aspect, the present invention prides a parallel test circuit employing a BOST (Built Out Self Test) including a properly operating chip. The parallel test circuit includes a first transfer circuit, a second transfer circuit, a comparator and a plurality of comparators. The first transfer circuit sequentially transfers a data pattern, supplied to the properly operating chip, in response to a clock signal. A data pattern supplied to the properly operating chip is supplied to one of a plurality of chips under test, and the remaining ones of the chips under test are supplied with a data pattern from corresponding stages of the first transfer circuit. The second transfer circuit sequentially transfers output data from the properly operating chip, as an expected value pattern, in response to the clock signal. The sole comparator that compares output data of the one chip under test to output data of the properly operating chip to determine whether or not the two output data coincide with each other. The multiple comparators, provided in association with the respective remaining chips under test, compare output data of the remaining chips under test with the expected value patterns from corresponding stages of the second transfer circuit. The parallel test circuit conducts parallel testing of the chips under test.

In a further aspect, the present invention provides a parallel test circuit for a semiconductor device including a plurality of IP (Intellectual Property) cores comprising a first transfer circuit, a second transfer circuit, a comparator and a plurality of comparators. The first transfer circuit sequentially transfers a data pattern, supplied to one of the IP cores, in response to a clock signal. A data pattern supplied to the one IP core is supplied to one of a plurality of IP cores under test. The remaining ones of the IP cores under test are supplied with data patterns from corresponding stages of the first transfer circuit. The second transfer circuit sequentially transfers output data from the one IP core, as an expected value pattern, in response to the clock signal. The sole comparator compares output data of the one IP core under test to output data of the IP core to determine whether or not the two output data coincide with each other. The multiple comparators are provided in association with the respective remaining IP cores under test and compare output data of the remaining IP cores under test with the expected value patterns from corresponding stages of the second transfer circuit to determine whether or not the output data and the expected value patterns coincide with each other.

In a further aspect, the present invention provides a method for parallel testing of a plurality of chips under test comprising the steps of:

receiving a data pattern to be supplied to the chips under test from a preceding stage to transfer the data pattern to a succeeding stage by a first transfer circuit;

receiving an expected value pattern of the chip under test from a preceding stage to transfer the expected value pattern to a downstream side stag by a second transfer circuit; and comparing an output of each of the chips under test to corresponding expected value pattern.

In a further aspect, the present invention provides a test method comprising the steps of:

sequentially transferring a data pattern supplied from a data pattern supply source by a first transfer circuit in response to a clock signal;

supplying the data pattern from the data pattern supply source to one of a plurality of chips under test, and sequentially supplying data patterns from corresponding stages of the first transfer circuit to remaining ones of the chips under test;

sequentially supplying an output of the one chip under test as an expected value pattern by the second transfer circuit in response to the clock signal; and comparing, for each of the remaining chips under test, output data of the chips under test and expected value patterns from corresponding stages of the second transfer circuit to determine whether or not the two coincide with each other, whereby a plurality of the chips under test may be tested in parallel using a sole data pattern supply source.

According to the present invention, uniform supply timings of the clock signal and the data pattern to the chips under test may be assured by a plurality of clock buffer stages that receive a clock signal from a clock supply source from one of the chips under test to another.

According to the present invention, the data pattern supply source and the clock supply source may be included in a test equipment output of the one chip under test is supplied to the test equipment and compared with an expected value pattern in a comparator in the test equipment.

According to the present invention, a plurality of parallel-connected chips under test is provided in a test method to operate as the one chip under test. The test method includes the steps of:

supplying a data pattern from the data pattern supply source and a clock signal from the clock supply source in parallel to a plurality of the chips under test connected in parallel; and receiving outputs of the chips under test, connected in parallel, giving a majority decision and delivering resulting output data as an expected value pattern to the second transfer circuit.

In a further aspect, the present invention provides a test method comprising the steps of:

sequentially transferring a data pattern from a data pattern supply source by a first transfer circuit in response to a clock signal;

sequentially transferring an expected value pattern from an expected value pattern supply source by a second transfer circuit in response to a clock signal;

supplying the data pattern from the data pattern supply source to one of the chips under test and sequentially supplying to remaining ones of the chips under test data patterns from corresponding stages of the first transfer circuit;

comparing output data of the one chip under test with the expected value pattern from the expected value pattern supply means to determine whether or not the two coincide with each other, and comparing, for each of the remaining ones of the chips under test, output data of the chips under test with the expected value patterns from corresponding stages of the second transfer circuit to determine whether or not the two coincide with each other.

In the test method according to the present invention, the data pattern supply source, clock supply source and the expected value pattern supply source are comprised within a test equipment, and the data pattern, the clock signal and the expected value pattern are all supplied from the test equipment.

In the test method according to the present invention, the data pattern and the expected value pattern are transferred in parallel on the first transfer circuit and on the second transfer circuit, respectively, by a plurality of bits as a unit.

In the test method according to the present invention, the test method further comprises the steps of:

serially transferring the data pattern on the first transfer circuit and serially transferring the expected value pattern on the second transfer circuit;

converting, for each of the chips under test, the serial data pattern, serially transferred within the first transfer circuit, into a parallel data pattern of a preset bit width;

converting, for each of the chips under test, the serial expected data pattern, serially transferred within the first transfer circuit, into a parallel data pattern of a preset bit width; and comparing, for each of the chips under test, output data from the chips under test, receiving the parallel data patterns, with the corresponding parallel expected value patterns, bit-by-bit, and outputting fail in case of non-coincidence of even one bit.

In the test method according to the present invention, the test method further comprises the steps of:

serially transferring the data pattern on the first transfer circuit and serially transferring the expected value pattern on the second transfer circuit;

converting a serial data pattern, serially transferred within the first transfer circuit, into a parallel data pattern of a preset bit width, in a manner common to a preset plural number of chips under test;

converting serial expected value patterns, serially transferred within the second transfer circuit, into a parallel data pattern of a preset bit width, in a manner common to the preset plural number of chips under test; and comparing output data from the chips under test to corresponding parallel expected value patterns, bit-by-bit, for each of a plurality of chips under test supplied with the parallel data patterns, to determine whether or not the output data and the parallel expected value patterns coincide with each other bit-by-bit to output fail in case of non-coincidence of even one bit.

In a further aspect, the present invention provides a test method for a semiconductor device in which one semiconductor device on a semiconductor wafer prior to a dicing step has a signal path that transfers a data pattern, an expected value pattern and a clock signal to one or more other semiconductor devices neighboring to the one semiconductor device with respect to at least one of one to four sides of the one semiconductor device. The method comprises the steps of:

selecting one signal path corresponding to one of one to four sides of the one semiconductor device and inputting a set of a data pattern, an expected value pattern and a clock signal from the signal path corresponding to the selected direction; and comparing output data of the chip under test with an expected value pattern received; the output data being data obtained as a result of operation of the chip under test that has received a selected data pattern and a clock signal, and outputting the data pattern, clock signal and the expected value pattern to at least one of one to four sides of the neighboring semiconductor devices.

A data pattern, a clock signal and an expected value pattern are supplied to the one semiconductor device on the semiconductor wafer. The data pattern, the clock signal and the expected value pattern may thus be sequentially transferred from the semiconductor device or devices neighboring to the one semiconductor device to other peripheral semiconductor devices.

In a further aspect, the present invention provides a test method employing a BOST (Built Out Self Test) including a properly operating chip. The method comprises the steps of:

sequentially transferring a data pattern, supplied to the properly operating chip, in response to a clock signal;

sequentially transferring output data from the properly operating chip, as an expected value pattern, in response to the clock signal;

applying a data pattern supplied to the properly operating chip to one of a plurality of chips under test and applying data patterns from corresponding stages of the first transfer circuit to remaining ones of the chips under test;

comparing output data of the one chip under test to output data of the properly operating chip to determine whether or not the two output data coincide with each other; and comparing output data of the remaining chips under test with the expected value patterns of corresponding stages of the second transfer circuit to determine whether or not the two coincide with each other. The parallel test circuit conducts parallel testing of the chips under test.

According to the present invention, there is provided a parallel test method for a semiconductor device including a plurality of IP (Intellectual Property) cores. The method comprises the steps of:

sequentially transferring a data pattern, supplied to one of the IP cores, on a first transfer circuit in response to a clock signal;

sequentially transfers output data from the one IP core, as an expected value pattern, in response to the clock signal;

applying a data pattern supplied to the one IP core to one of a plurality of IP cores under test and applying data patterns from corresponding stages of the first transfer circuit to remaining ones of the IP cores under test;

comparing output data of the one IP core under test to output data of the IP core to determine whether or not the two output data coincide with each other; and comparing, for each of the remaining IP cores under test, output data of the remaining IP cores under test with the expected value patterns of corresponding stages of the second transfer circuit.

According to the present invention, there is provided a circuit for parallel testing in which chips under tests are separated from a circuit section that transfers a data pattern, and the data pattern from the transfer circuit section is supplied via a non-contact interface to a plurality of chips under test. According to the present invention, the circuit chips are separated from a circuit section that transfers an expected value pattern. The comparators that compare outputs of the chips under test with the expected value pattern are provided on the side of the transfer circuit section. The comparators receive output patterns of the chips under test via a non-contact interface.

According to the present invention, the chips under test are separated from the transfer circuit section that transfers the data pattern and from the transfer circuit section that transfers the expected value pattern. The data pattern and the expected value pattern are supplied via a non-contact interface to the chips under test, and the comparator section that compares outputs of the chips under test with the expected value pattern are provided on a side where the chips under test are provided.

According to the present invention, the chips under tests and the circuit section for transferring the data pattern are separated, and the data pattern from the transfer circuit section is supplied through a non-contact interface to the chips under test. According to the present invention, the chips under tests may be separated from the circuit section that transfers the expected value pattern. The comparator section provided on a side where the transfer circuit section is provided may receive outputs of the chips under test via a non-contact interface and compare the outputs to corresponding expected value patterns.

According to the present invention, the chips under test may be separated from the transfer circuit section that transfer the data pattern and the circuit section that transfers the expected value pattern. The data pattern and the expected value pattern may be supplied via the non-contact interface to a plurality of chips under test, and outputs of the chips under test and corresponding expected value patterns may be compared with each other at a comparator section provided on a side where the chips under test are provided.

According to the present invention, a test pattern is supplied to the circuit that sequentially transfers the test pattern to enable a plurality of chips under test to be sequentially tested in response to clock cycles. This should suppress the number of the input/output ports, needed for the tester, from being increased even in case the number of the devices under test is increased.

In addition, according to the present invention, the test pattern and the clock are supplied to a certain die from a prober at the time of wafer testing, thus enabling parallel testing to be carried out sequentially in response to clock cycles. The number of the input/output ports, needed for the tester, may thus be suppressed from being increased. In addition, the number of times of position shifting of the probe sites or the number of times of contact may be decreased, thus providing for shorter test time.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 16 is a block diagram for illustrating parallel testing.

PREFERRED MODES

The present invention, outlined as described above, will now be described in detail with reference to the accompanying drawings. In the present invention, there are provided first transfer circuits (11-1, 11-2 and 11-3, . . . of FIG. 1) in connection with a plurality of stages of chips (10-1, 10-2 and 10-3, . . . of FIG. 1) which are being put to parallel testing. These chips under test are also termed devices under test (DUTs). The first transfer circuits sequentially transfer a data pattern, supplied from a supply source (1) of the data patterns, in response to a clock signal. The data pattern from the data pattern supply source is supplied to one chip under test (10-1) of the plural chips under test (10-1, 10-2 and 10-3, . . . ). To each of the remaining chips under test (10-2 and 10-3, . . . ) is sequentially applied the data pattern from the corresponding one of the first transfer circuits. There is also provided second transfer circuits (12-1, 12-2 and 12-3, . . . of FIG. 1) that sequentially transfer an output of the chip under test (10-1) as a pattern of expected value pattern in response to the expected value pattern. There is also provided comparators (14-1 and 14-2, . . . of FIG. 1) that are associated with the remaining chips under test (10-2 and 10-3, . . . ) and that compare output data of the chips under test with the expected value pattern from the corresponding stages of the second transfer circuits (12-1, 12-2 and 12-3, . . . ). A plurality of chips under test may thus be tested in parallel using one data pattern supply source. The timing control is exercised by clock buffers (13-1, 13-2 and 13-3, . . . of FIG. 1) such that there persists uniform relationship between the clock and data applied. Although no restriction is imposed on the present invention, the chips under test may be sequentially tested, from one clock cycle to the next. With this configuration, the number of the input/output ports, needed for testing, remains unchanged even if the number of the chips under test is increased. Alternatively, the second transfer circuits (12-1, 12-2 and 12-3, . . . ) may sequentially transfer an expected value pattern from an expected value pattern supply source in response to the clock signal. Or, the data pattern or the expected value pattern may be supplied as serial bit data and converted into parallel data by a pipeline stage associated with the chip under test. The resulting parallel data may then be applied to the chip under test, and an output of the chip under test may then be compared with an expected value of the parallel bits. In the following, specified Examples of the present invention will now be described.

EXAMPLES

Figure 1:
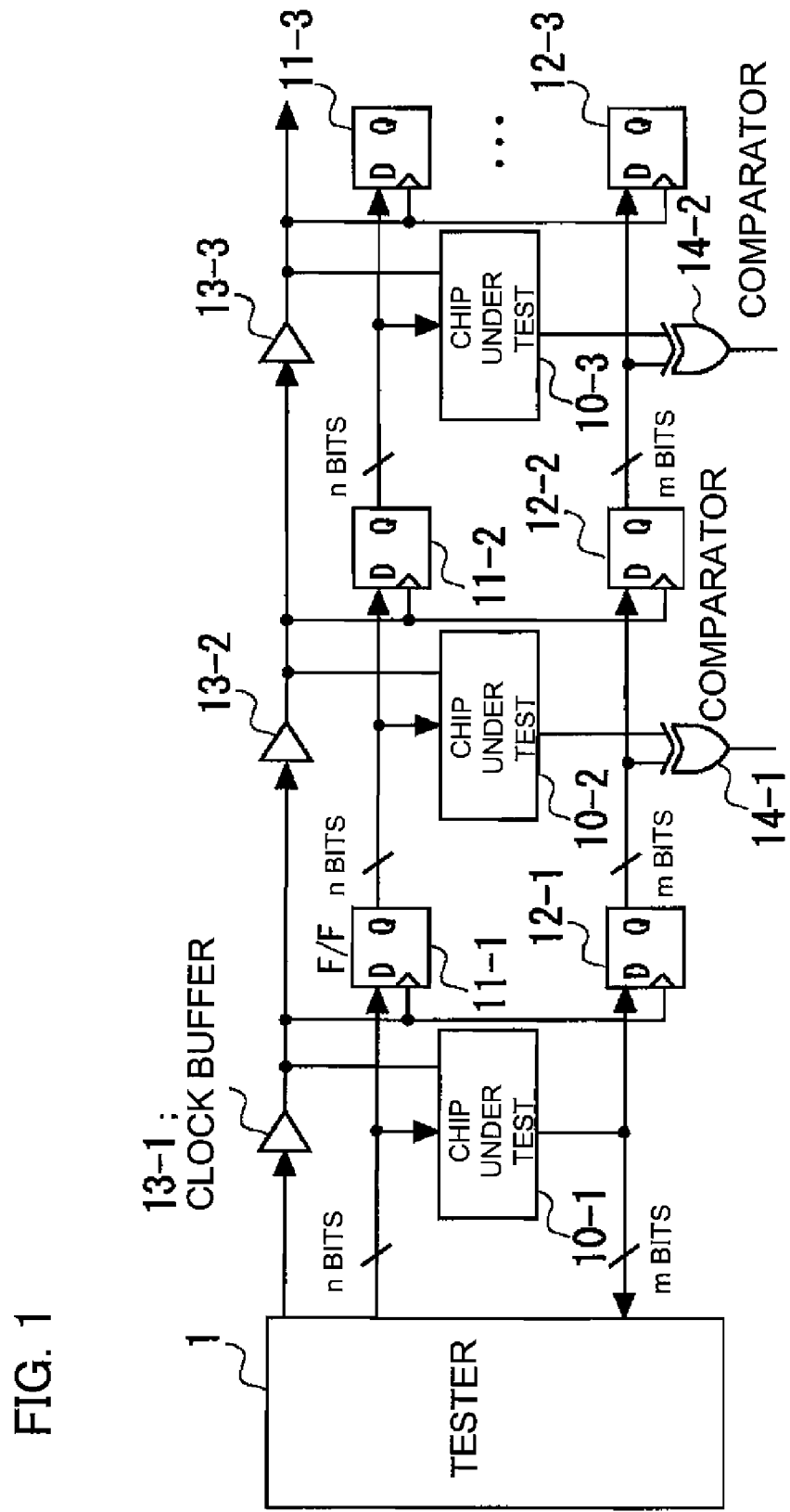
FIG. 1 is a circuit diagram showing a configuration of Example 1 of the present invention.

FIG. 1 is a circuit diagram showing a configuration of an Example of the present invention. Specifically, FIG. 1 shows the configuration of a tester 1 and a test board, also termed a load board, arranged on a test head of the tester 1. In the following, a functional test, in which a data pattern (force data) and a clock signal are applied from the tester to a chip under test and an output pattern from the chip under test is compared with the expected value pattern, is taken as an example for explanation. The tester may thus be any of an LSI tester, an analog/digital mixed tester or a memory tester, provided that the tester has the basic configuration needed to carry out the functional test. Alternatively, the tester may be a tester having a simplified structure including a pattern generator, a clock generator and a comparator. The chip under test (DUT) is an optional semiconductor integrated circuit to be subjected to the functional test. An AC test (e.g. timing margin test) may also be carried out using this test circuit (test board). The DC test, which applies a DC signal (DC stimulus) to the chip under test and measures its response (voltage/current) is outside the scope of the present invention and may be conducted on a separate dedicated test board. The DC test may also be conducted by a dedicated DC tester.

Referring to FIG. 1, a data signal output from the tester 1 (n-bit-parallel data pattern) is supplied to an input terminal of a chip under test 10-1 and to a data input terminal D of a D-flip-flop, abbreviated to F/F 11-1. The n pieces of FFs 11-1 for n-bits are arranged in parallel, in correspondence with a data signal of n-bit width. Only one FF is shown for simplicity. The D-flip-flop, also termed a D-register, samples the data signal at the data input terminal D responsive to a rising edge of the clock to output the data signal at a data output terminal Q. Other F/Fs 11-2 and 11-3 are configured in a similar manner.

The clock signal, output from the tester 1, is supplied to an input terminal of the clock buffer 13-1. An output clock of the clock buffer 13-1 is supplied to the chip under test 10-1, while being also supplied to an input terminal of the next stage clock buffer 13-2.

An output of the chip under test 10-1 (m-bit parallel data) is supplied to the tester 1, while being also supplied to the data input terminal D of a D-flip-flop (abbreviated to F/F) 12-1. An output clock from the clock buffer 13-1 is supplied to the input terminal of the F/F 12-1. The n pieces of FFs 12-1 for n-bit are arranged in parallel, in correspondence with a data signal of n-bit width. Only one FF is shown for simplicity. The D-flip-flop, also termed a D-register, samples the data signal at the data input terminal D responsive to a rising edge of the clock to output the data signal at the data output terminal Q. Other F/Fs 12-2 and 12-3 are configured in a similar manner.

An n-bit-parallel data signal from the data output terminal Q of the F/Fs 11-1 is supplied to an input terminal of the chip under test 10-2 and to a data input terminal D of the next stage F/F 11-2.

An output clock of the clock buffer 13-2 is supplied to the chip under test 10-2 and to an input terminal of the next stage clock buffer 13-3.

An m-bit-parallel expected value from the data output terminal of the F/Fs 12-1 is supplied to a data input terminals D of the next stage F/Fs 12-2 and to an input terminal of a comparator 14-1. An m-bit output of the chip under test 10-2 is supplied to the other input terminal of the comparator 14-1. The comparator 14-1 compares the m-bit expected value pattern from the F/F 12-1 with the output data of the chip under test 10-2 to check whether or not these coincide with each other. Though not limiting the present invention, the comparator 14-1 outputs a High level signal in case the two inputs are non-coincident with each other, more specifically, in case even one bits out of two m-bit inputs being compared with each other is non-coincident. An output clock from the clock buffer 13-2 is supplied to a clock input terminal of the F/F 12-2.

The comparator 14-1 is shown in FIG. 1 by a single exclusive-OR (EXOR) circuit. In actuality, the comparator includes an OR circuit and an m-number of two-input exclusive-OR (EXOR) circuits for comparing the m-bit output of the chip under test 10-2 to the m-bit expected value pattern on the bit-by-bit basis. The OR circuit takes OR of an m-number of outputs of the two-input exclusive-OR (EXOR) circuits. The comparator 14-2 is configured in similar manner.

An m-bit-parallel data signal from the data output terminal Q of the F/F 11-2 is supplied to an input terminal of the chip under test 10-3, while being supplied to a data input terminal of the next stage F/F 11-3.

An output clock of the clock buffer 13-3 is supplied to the chip under test 10-3, while being supplied to a next stage clock buffer, not shown. An n-bit parallel expected value from the data output terminal of F/F 12-2 is coupled to a data input terminal of the next stage F/F 12-3 and to the comparator 14-2. An output of the chip under test 10-3 is supplied to the comparator 14-2. The comparator 14-2 compares the expected value from F/F 12-2 with the output data of the chip under test 10-3 to check to see whether or not these coincide with each other. In case of non-coincidence, the comparator delivers a High level signal. The outputs of the comparators 14-1 and 14-2 are supplied to and sampled in the tester 1.

Thus, in the present Example, a pattern (force patter) is applied to a plurality of chips under test. More specifically, a data pattern from the tester 1 is transferred to input terminals of the sequentially succeeding chips under test on the clock-by-clock basis via a transfer circuit including cascade-connected F/F 11-1, F/F 11-2, F/F 11-3 and so forth. An output data of the chip under test 10-1 closest to the tester 1 is transferred, as the expected value pattern, to sequentially succeeding stages via one other transfer circuit including cascade-connected F/F 12-1, F/F 12-2, F/F 12-3 and so forth. The so transferred data is thus supplied to associated stage comparators as expected value pattern for the sequentially succeeding stages of the chips under test.

In FIG. 1, the direction of clock propagation is the same as the data flow direction through the F/Fs. However, the direction of clock propagation may, of course, be opposite to the data flow direction through the F/Fs.

The pass/fail of the chips under test may be detected by the comparators 14-1, 14-2 and so forth that receive outputs of the chips under test as inputs. The chip under test, output data of which has once been detected to be non-coincident with the expected value pattern, is determined to be a failed chip. It should be noted that failure of one or more of the chip under test 10-2, chip under test 10-3 and so forth, other than the chip under test 10-1, has nothing to do with the operation of the entire system. The pass/fail of the chip under test 10-2, chip under test 10-3 and so forth is decided depending on whether output data thereof is coincident with output data of the chip under test 10-1. Thus, if the chip under test 10-1 is failed, that is, defective, pass/fail of the chip under test 10-2, chip under test 10-3 and so forth may not be decided. For this reason, a so-called KGD (Known Goof Device) or a reference device is used as the chip under test 10-1.

Figure 2:
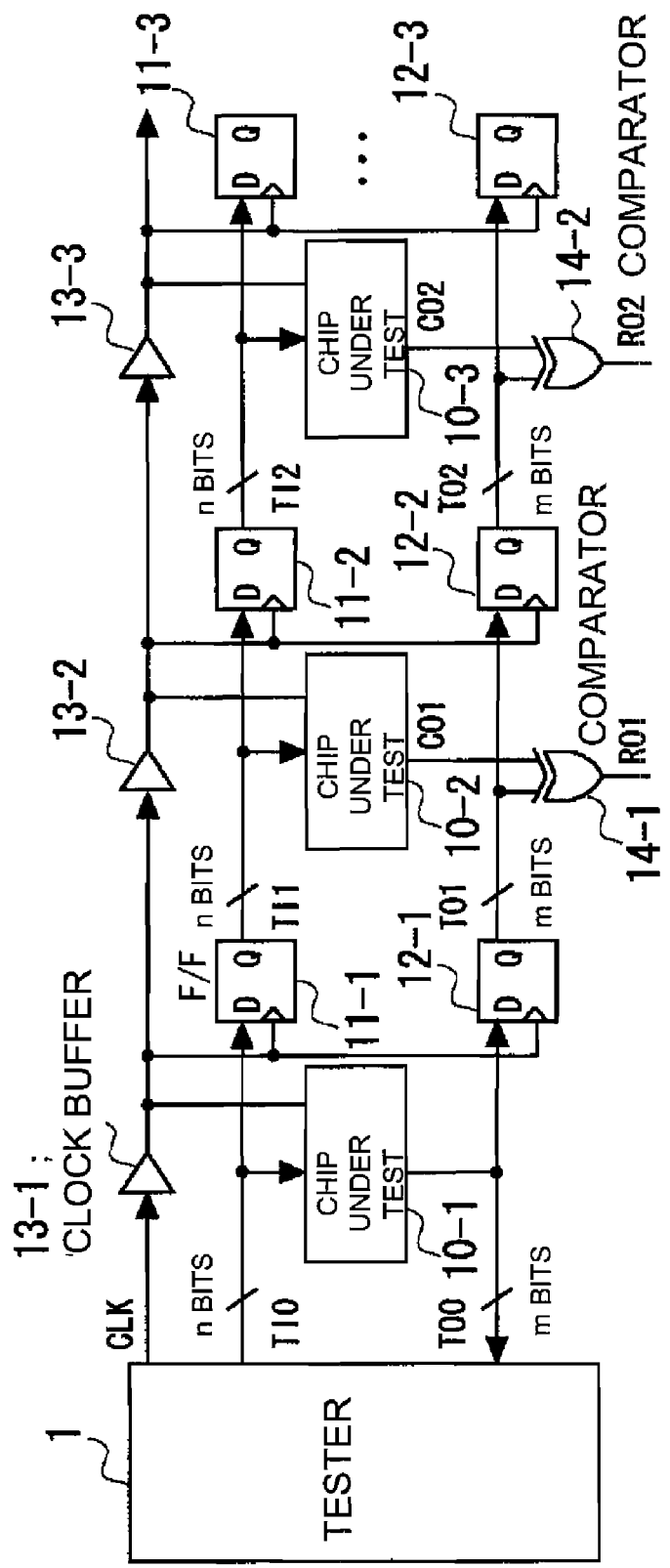
FIG. 2 is a circuit diagram for illustrating the Example 1 of the present invention.
Figure 3:
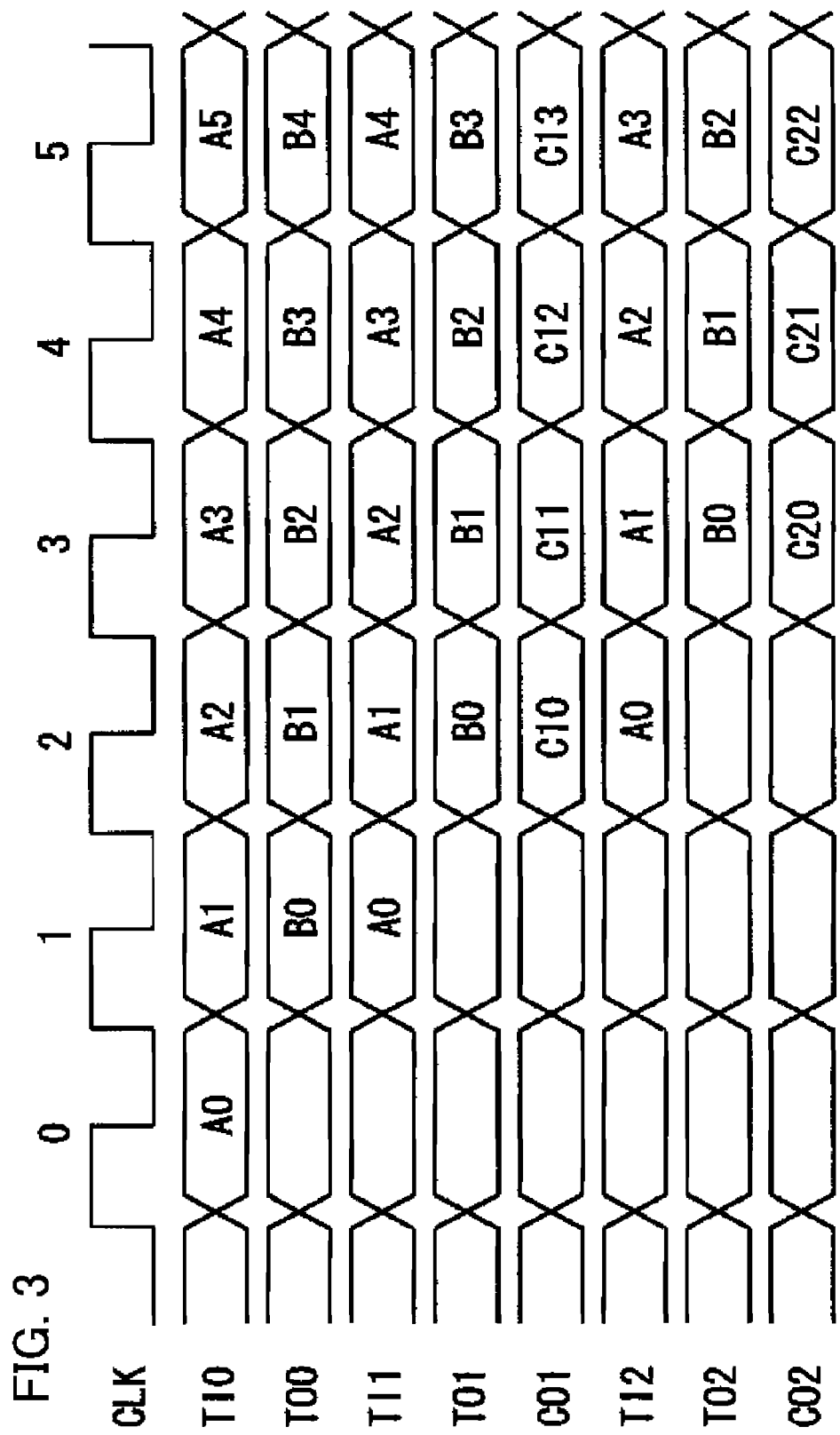
FIG. 3 is a timing diagram for illustrating the operation of the Example 1 of the present invention.

FIGS. 2 and 3 illustrate the Example of the present invention shown in FIG. 1. Specifically, FIG. 2 depicts the circuit diagram of FIG. 1 in which signal names are assigned. FIG. 3 depicts a timing diagram showing operational waveforms of the respective signals shown in FIG. 2.

CLK is a clock signal output from the tester 1. The clock period, duty cycle and so forth may optionally be set on the tester side.

TI0 is n-bit data output from the tester 1. TI0 is output as A0, A1, A2, A3, A4, A5 and so forth at clock cycles 0, 1, 2, 3, 4, 5 and so forth.

TI1 is n-bit data output from F/F 11-1. TI0 is output as A0, A1, A2, A3, A4 and so forth at clock cycles 1, 2, 3, 4, 5 and so forth, with a delay of one clock cycle from TI1.

TI2 is n-bit data output from F/F 11-2. TI2 is output as A0, A1, A2, A3 and so forth at clock cycles 2, 3, 4, 5 and so forth, with a delay of one clock cycle from TI1.

TO0 is an m-bit output of the chip under test 10-1. TO0 is output as B0, B1, B2, B3, B4 and so forth at clock cycles 1, 2, 3, 4, 5 and so forth.

TO1 is an m-bit output of the F/F 12-1. TO1 is output as B0, B1, B2, B3 and so forth at clock cycles 2, 3, 4, 5 and so forth.

TO2 is an m-bit output of the F/F 12-2. TO2 is output as B0, B1, B2 and so forth at clock cycles 3, 4, 5 and so forth.

CO1 is an m-bit output of the chip under test 10-2. CO1 is output as C10, C11, C12 and so forth at clock cycles 2, 3, 4, 5 and so forth.

CO2 is an m-bit output of the chip under test 10-3. CO2 is output as C20, C21 and so forth at clock cycles 3, 4, 5 and so forth.

The data output from the tester 1 and the output data of the chip under test 10-1 are shifted towards right in FIG. 2 on the clock-by-clock basis.

For example, at the clock cycle 0, the data pattern A0 is delivered from the tester 1 to the chip under test 10-1.

At the next clock cycle 1, the output B0, corresponding to A0, is output from the chip under test 10-1. At this clock cycle 1, A1 is output from the tester 1 to the chip under test 10-1, while A0, output from F/F 11-1, is supplied to the chip under test 10-2.

At the clock cycle 2, a response B1 to the pattern A1 supplied to the chip under test 10-1 is output from the chip under test 10-1, while A2 is supplied from the tester 1 to the chip under test 10-1. A1 output from F/F 11-1 is supplied to the chip under test 10-2, while A0 from F/F 11-2 is supplied to the chip under test 10-3. Outputs B1 and C10 are output from the chips under test 10-1 and 10-2 as response to the patterns A1 and A0 supplied, while B0 output from F/F 12-1 is supplied to the comparator 14-1 and so forth so that the data pattern is transferred through F/F 11-1, F/F 11-2, F/F 11-3 and so on every clock cycle. The output of the chip under test 10-1 is thus transferred as the expected value pattern through F/F 12-1, F/F 12-2, F/F 12-3 and so forth.

In this manner, output data of the chip under test 10-2 and the chip under test 10-3, except the chip under test 10-1, are compared with the output data from the chip under test 10-1. That is, the output data CO1 of the chip under test 10-2 is compared with the output of the chip under test 10-1 (output of F/F 11-1) by the comparator 14-1 and the comparator 14-1 then outputs a result of comparison RO1. The output data CO2 of the chip under test 10-3 is compared with the output of the chip under test 10-1 (output of F/F 11-2) by the comparator 14-2 and the comparator 14-2 then outputs a result of comparison RO2.

In the present Example, the tester 1 inputs the output data T00 of the chip under test 10-1 and compares it with the expected values in a comparator, which is not shown and provided in the tester 1.

With the present Example, the tester 1 is able to perform parallel testing of a plurality of the chips under test, using input/output ports (channels or drivers/comparators) used for testing a chip under test. For example, in case the bit width n of the data pattern and the bit width m of the expected value pattern are both 64 bits, any number of chips under test basically may be tested with the 64-number of the input/output ports (drivers and comparators).

In addition, the present Example includes a clock distribution circuit made up of clock buffers (13-1, 13-2, 13-3 and so on) that deliver clock signals to the chips under test, data transferring circuits (11-1, 11-2, 11-3 and so on) and expected value pattern transferring circuits (12-1, 12-2, 12-3 and so on). Hence, the timing phase between the clock signals in the respective chips under test and the data patterns supplied may be rendered substantially uniform among the respective chips under test. That is, by providing the clock distribution circuit, the waveform blunting of the clock may be avoided to enable functional test and AC test (measurement of delay time, timing margin test or the like) to be conducted at a higher frequency. This should constitute one of features of the present invention.

If, in the above Example, the first chip under test 10-1, as counted from the tester side, has failed, it is not possible to test the remaining chips under test 10-2, 10-3 and so forth.

Figure 4:
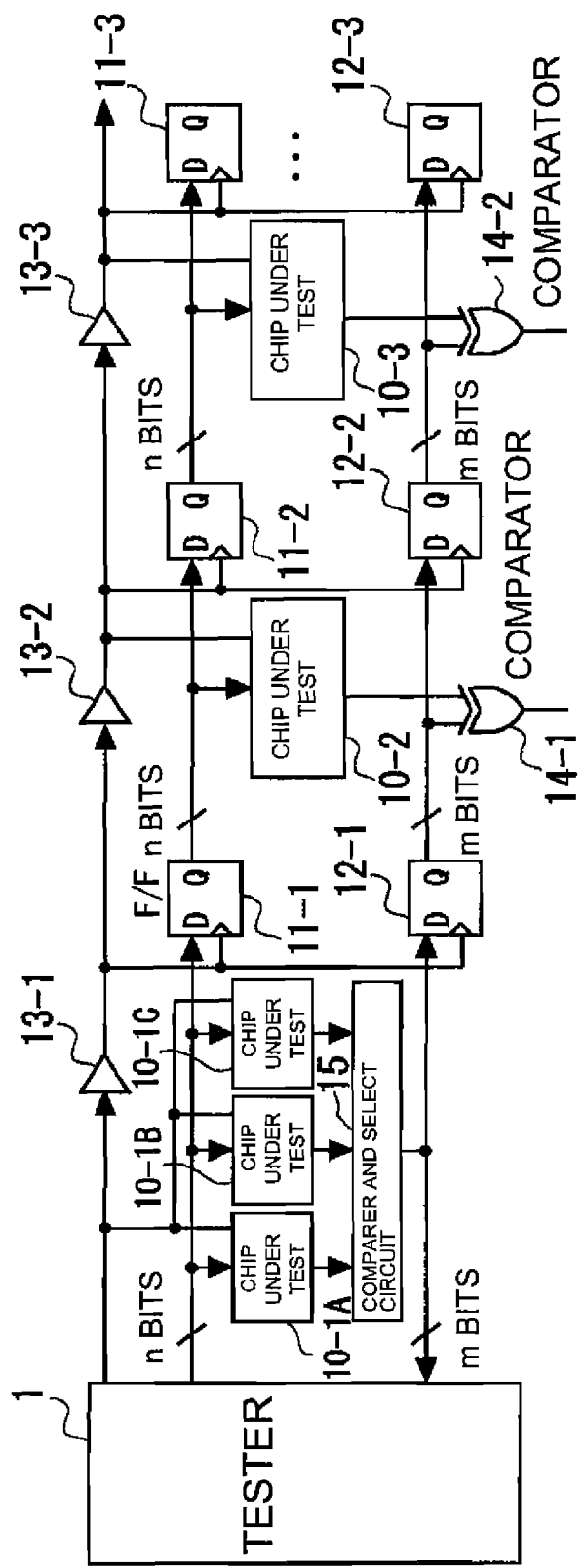
FIG. 4 is a circuit diagram showing a configuration of Example 2 of the present invention.

FIG. 4 shows a configuration of Example 2 of the present invention. Referring to FIG. 4, the present Example, shown therein, includes three chip under test 10-1A, 10-1B and 10-1C, arranged in parallel, at the position closest to the tester, in place of the sole chip under test 10-1 (see FIG. 1). The present Example also includes a compare and select circuit 15 that inputs m-bit output data of chips under test 10-1A, 10-1B and 10-1C to select data based on majority decision to output the so selected data.

The compare and select circuit 15 operates so that, in case one of three m-bit outputs of the three chips under test 10-1A, 10-1B and 10-1C is not coincident from the remaining two outputs which are coincident with each other, the circuit selects the coincident two outputs. If all of the three m-bit outputs are coincident, the circuit outputs the coincident outputs. By taking majority decision of the three outputs, failure of one of the chips under test is not of a problem. The m-bit output of the compare and select circuit 15 is supplied to the tester 1 and to the data input terminal D of F/F 12-1. Although outputs of the three chips under test are supplied to the compare and select circuit 15, in FIG. 4, the number of inputs to the compare and select circuit 15 may also be four instead of three as shown. In case the compare and select circuit 15 has four inputs, failure of two chips under test is not of a problem.

Figure 5:
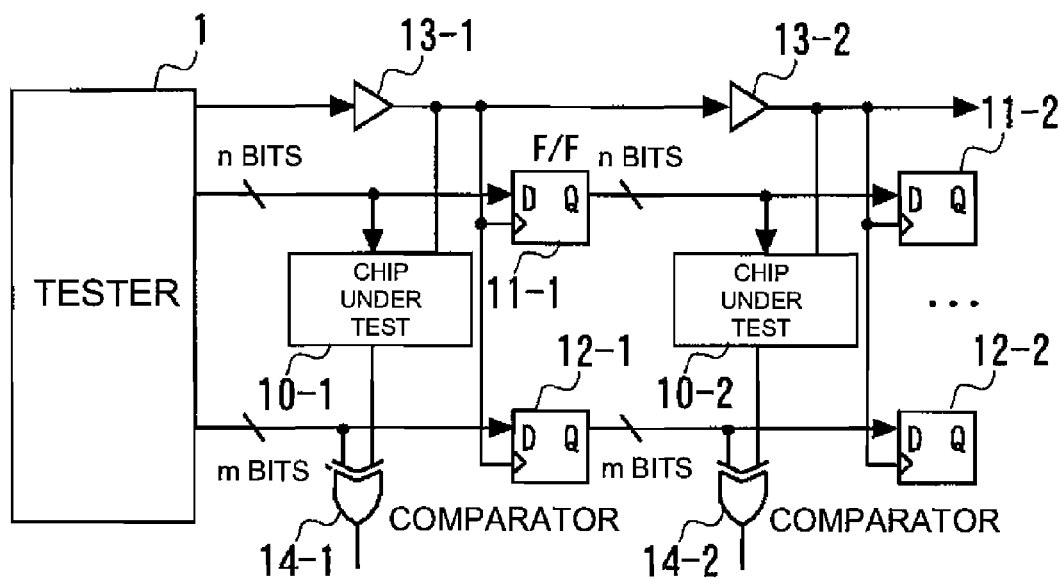
FIG. 5 is a circuit diagram showing a configuration of Example 3 of the present invention.

FIG. 5 shows the configuration of Example 3 of the present invention. In the present Example, the tester 1 outputs an m-bit expected value pattern in parallel. The output expected value pattern is supplied to the comparator 14-1 provided in association with the first chip under test, while being supplied to a data input terminal D of F/F 12-1.

The comparator 14-1 compares an m-bit output of the chip under test 10-1 with an m-bit expected value pattern output from the tester 1. In case of non-coincidence, specifically, should even one bits of the m bits of the two m-bit inputs be non-coincident, the comparator outputs a High level.

The comparator 14-2 compares an output of F/F 11-2 with the expected value from the tester 1 as transferred from F/F 12-1.

The present Example overcomes the problem that, if the chip under test 10-1 has failed, testing from the remaining chips under test 10-2, 10-3 and so on is not possible. If the chip under test 10-1 has failed, with the output of the comparator 14-1 being High, the outputs of the remaining chips under test 10-2, 10-3 and so on are compared with the expected value pattern from the tester 1, and hence the pass/fail may be detected correctly.

Figure 6A:
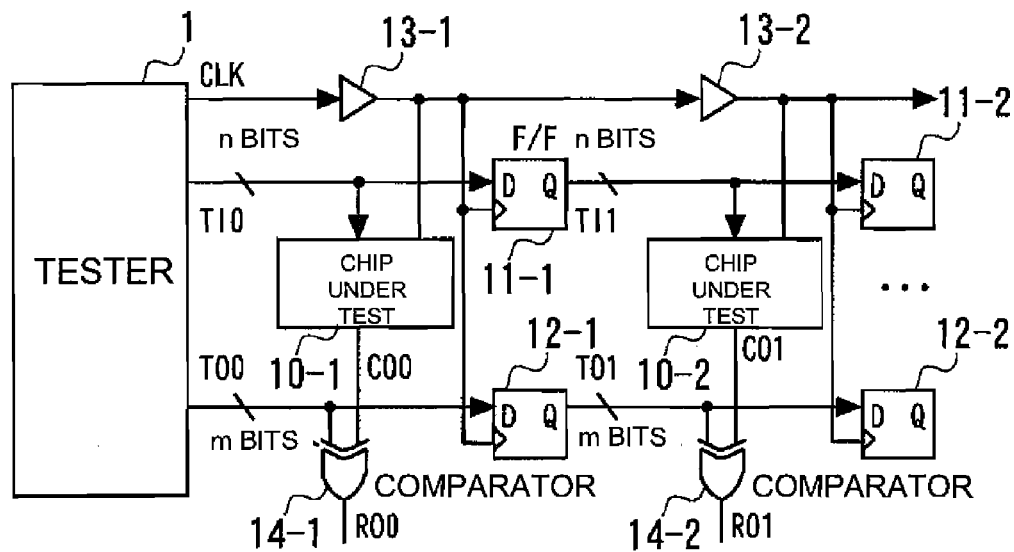
FIGS. 6A and 6B are respectively a circuit diagram and a timing chart for illustrating Example 3 of the present invention.
Figure 6B:
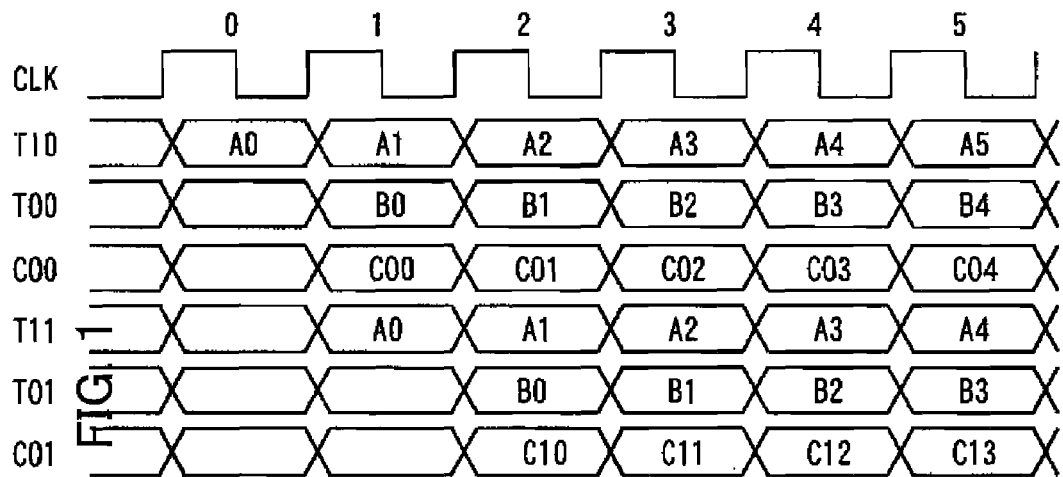

FIGS. 6A and 6B illustrate the operation of the present Example. Specifically, FIG. 6A depicts the circuit diagram of FIG. 5 in which signal names are assigned. FIG. 6B depicts a timing diagram showing operational waveforms of the respective signals shown in FIG. 6A.

CLK is a clock signal output from the tester 1.

TI0 is an output (an n-bit data pattern) of the tester 1. TI0 is output as A0, A1, A2, A3, A4, A5 and so forth at clock cycles 0, 1, 2, 3, 4, 5 and so forth.

TO0 is an output (an m-bit expected value pattern) of the tester 1. TO0 is output as B0, B1, B2, B3, B4 and so forth at clock cycles 1, 2, 3, 4, 5 and so forth.

CO0 is an m-bit output of the chip under test 10-1. CO0 is output as C00, C01, C02, C03, C04 and so forth at clock cycles 1, 2, 3, 4, 5 and so forth.

TI1 is an n-bit output of F/F 11-1, and is output as A0, A1, A2, A3, A4 and so forth at clock cycles 1, 2, 3, 4, 5 and so forth with a delay of one clock cycle from TI0.

TO1 is an m-bit output of F/F 12-1, and is output as B0, B1, B2, B3, B4 and so forth at clock cycles 2, 3, 4, 5 and so forth.

CO1 is an m-bit output of the chip under test 10-2, and is output as C10, C11, C12, C13 and so forth at clock cycles 2, 3, 4, 5 and so forth.

At the clock cycle 0, A0 is output from the tester 1 to the chip under test 10-1 and, at the next clock cycle 1, C00 is output from the chip under test 10-1. At the clock cycle 1, the output data C00 of the chip under test 10-1 is compared with an expected value B0 from the tester 1 to output a result of comparison R00. At the clock cycle 1, A1 from the tester 1 is supplied to the chip under test 10-1, while A0 from F/F 11-1 is supplied to the chip under test 10-2.

At the next clock cycle 2, an output C01 is output from the chip under test 10-1, as a response to A1, and is compared by the comparator 14-1 to the expected value B1 from the tester 1. On the other hand, A2 is output from the tester 1 to the chip under test 10-1, while A1 from F/F 11-1 is supplied to the chip under test 10-2. An output C10 is output, as a response to A0, from the chip under test 10-2, and is then compared with the expected value B0 from F/F 12-1 by the comparator 14-2. Thus, in the present Example, the data pattern and the expected value pattern are supplied from the tester 1, and the decision as to pass/fail is given by the comparators 14-1, 14-2 and so forth.

Figure 7:
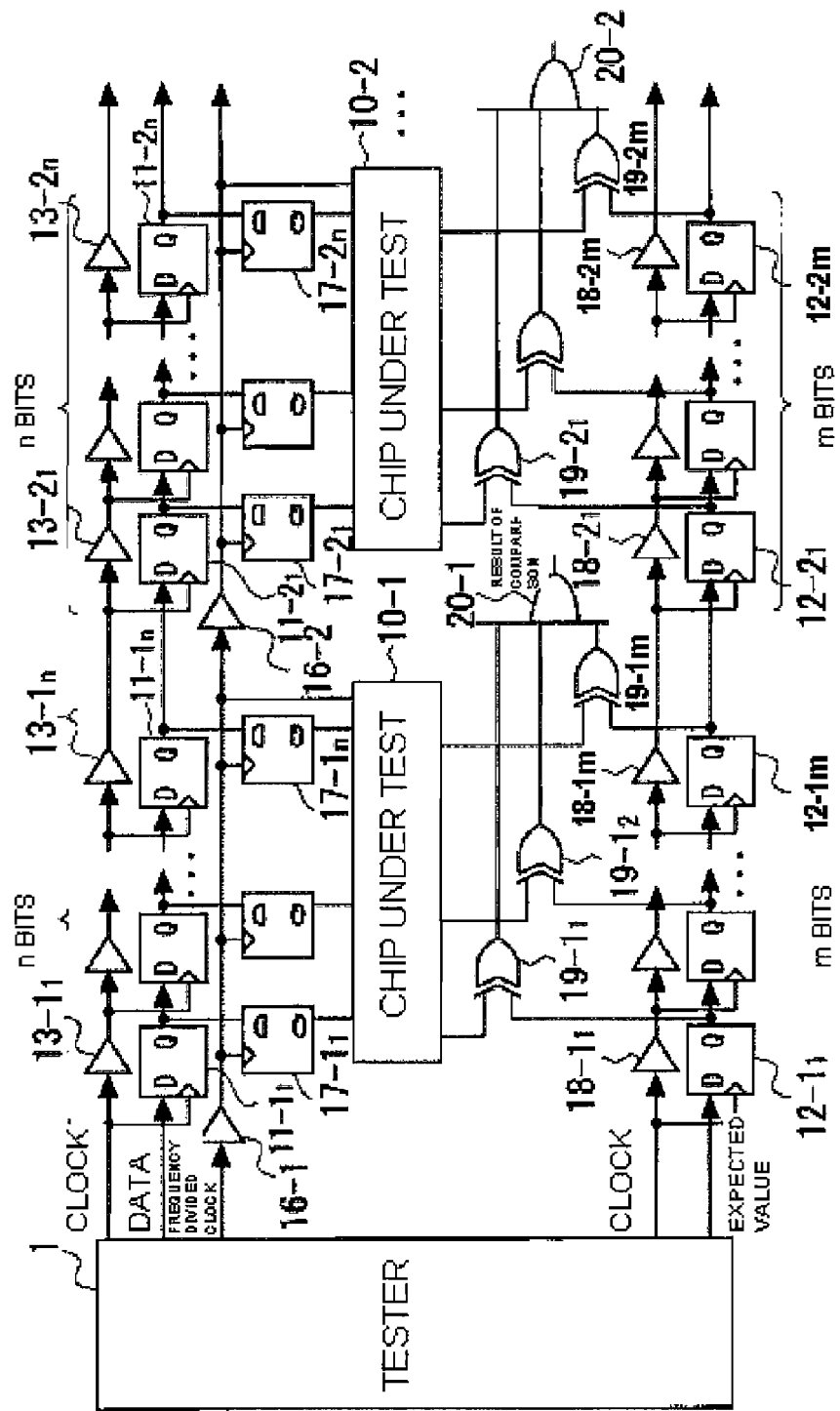
FIG. 7 is a circuit diagram showing a configuration of Example 4 of the present invention.

An Example 4 of the present invention is now described. FIG. 7 shows a configuration of the present Example 4. In the previous Examples, the data pattern and the expected value pattern from the tester 1 are n-bit parallel data and m-bit parallel data, respectively. With the present Example, both the data pattern and the expected value pattern are serial data. With the present Example, it is sufficient that the tester 1 has one output port (channel) for each of the data pattern and the expected value pattern.

Referring to FIG. 7, the serial bit data, supplied from the tester 1, is sequentially transferred through n-number flip-flops F/F 11-1$_1$ to F/F 11-1$_n$. Outputs of the F/s 11-1$_1$ and F/F 11-1$_n$ (n bits) are sampled at the same timing by F/F 17-1$_1$ and F/F 17-1$_n$ that receive as sampling clock a 1/n frequency divided clock supplied from the tester 1 (outputs of a clock buffer 16-1). The outputs of the F/F 11-1$_1$ and F/F 11-1$_n$ are then supplied as n-bit parallel data to the input terminals of the chip under test 10-1. The F/F 11-1$_1$ and F/F 11-1$_n$ and the F/F 17-1$_1$ and F/F 17-1$_n$ that sample the outputs of the F/F 11-1$_1$ and F/F 11-1$_n$ with the frequency divided clock compose a serial-to-parallel converter circuit. An output of the clock buffer 16-1 (frequency divided clock) is supplied to the chip under test 10-1, while being supplied to a next stage clock buffer 16-2. The chips under test 10-1, 10-2 and so on are driven by the frequency divided clock. The F/F 11-1$_1$ and F/F 11-1$_n$, F/F 11-2$_1$ and F/F 11-2$_n$, F/F 12-1$_1$ and F/F 12-1$_m$, F/F 12-2$_1$ and F/F 12-2$_m$, F/F 17-1$_1$ and F/F 17-$_n$ and F/F 17-2$_1$ and F/F 17-2$_n$ are all D flip-flops that input 1-bit data to output 1-bit data. In the present Example, it is sufficient that the serial-to-parallel converter circuit serially transfers serial bit data to the next stages while outputting the serial data in parallel on the n-bit basis, and hence the arrangement shown in FIG. 7 is not to be construed in the limiting meaning.

The expected value pattern from the tester 1 is serially output and sequentially sampled by an m-number of flip-flops F/F 12-1$_1$ and F/F 12-1$_m$, so that the m-bit expected value is latched by each of the m-number of the flip-flops F/F 12-1$_1$ and F/F 12-1$_m$ every m-number of clocks. The outputs of the m-number of the flip-flops F/F 12-1$_1$ and F/F 12-1$_m$ are compared with the m-bit output of the chip under test by an m-number of comparators (EXOR circuits) 19-$_1$ to 19-1$_m$. An OR circuit 20-1 outputs a logical sum of the outputs of the EXOR circuits 19-1$_1$ to 19-1$_m$ as being the result of comparison. The OR circuit outputs a High level if even only one output of the EXOR circuits 19-1$_1$ to 19-1$_m$ is High.

Figure 8:
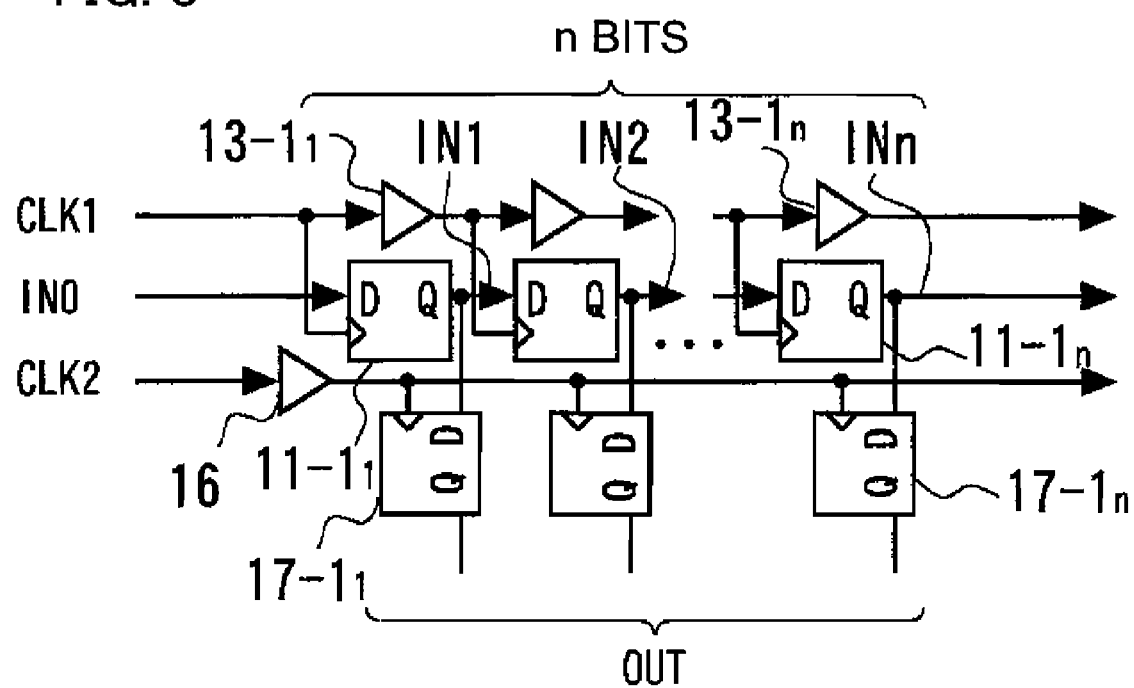
FIG. 8 is a circuit diagram for illustrating Example 4 of the present invention.
Figure 9:
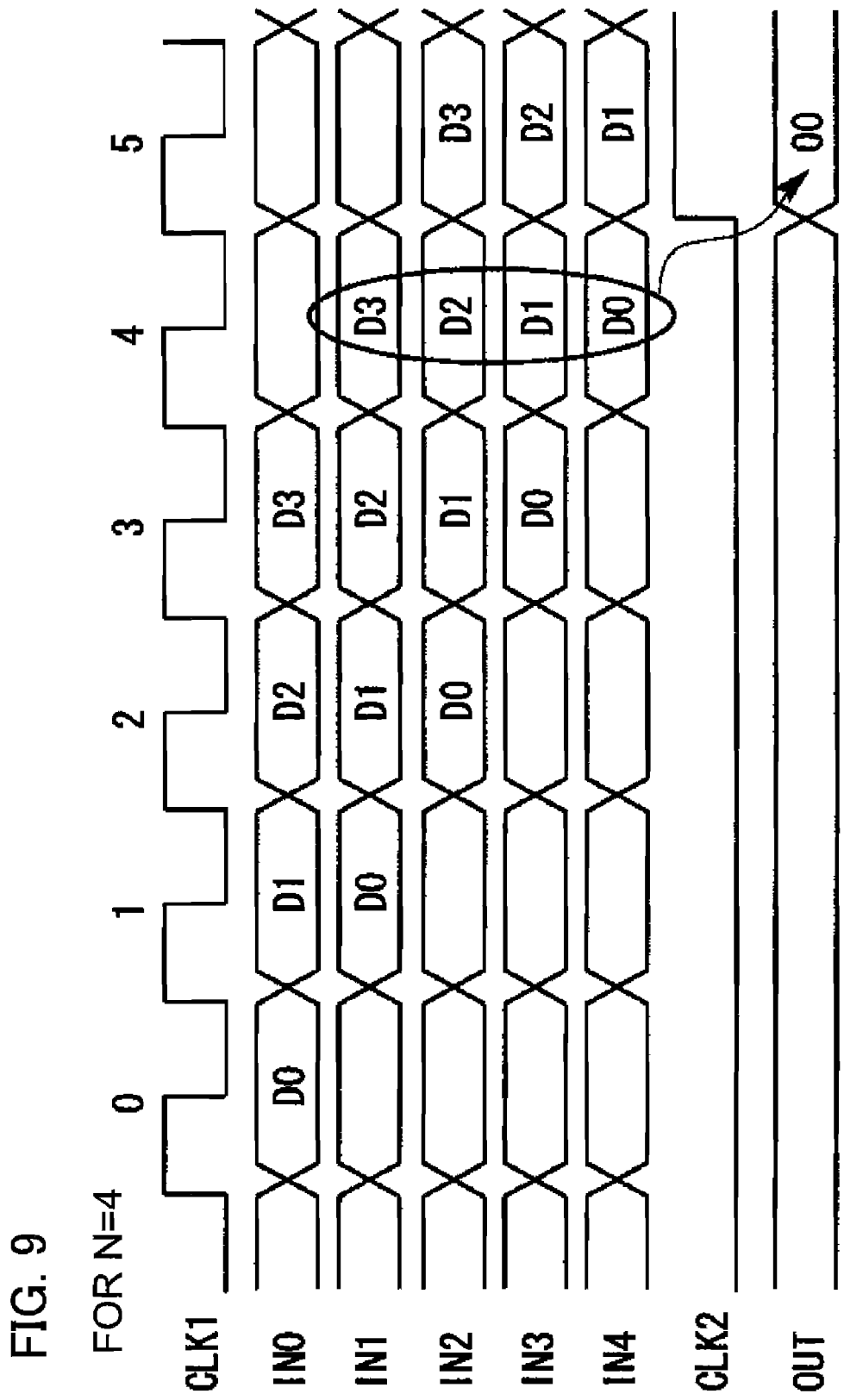
FIG. 9 is a timing diagram for illustrating the operation of Example 4 of the present invention.

FIG. 8 is a circuit diagram for illustrating the n-bit serial-to-parallel converter circuit shown in FIG. 7. FIG. 9 is a timing diagram for illustrating the operation for n=4 in FIG. 8.

In FIG. 8 and FIG. 9, CLK1 and CLK2 are a clock signal from the tester and a 1/n frequency divided clock, respectively. IN0 is a data pattern transferred from the tester. Serial bit data D0, D1, D2, D3 and so on, delivered from the data pattern IN0, are sequentially transferred through the F/F $11\text{-}1_1$ to F/F $11\text{-}1_n$ every clock pulse CLK1. After n-number of times (four times in the example of FIG. 9) of the transfer operations, outputs IN1, IN2, . . . , INn of the F/F $11\text{-}1_1$ to F/F $11\text{-}1_n$ (4-bit parallel data of D3, D2, D1, D0 in FIG. 9) are sampled by the F/F $17\text{-}1_1$ to F/F $17\text{-}1_n$ at the rising edge of the frequency divided clock CLK2. The so sampled outputs are supplied as parallel data output OUT to the input terminal of the chip under test (10-1 of FIG. 7).

Figure 10:
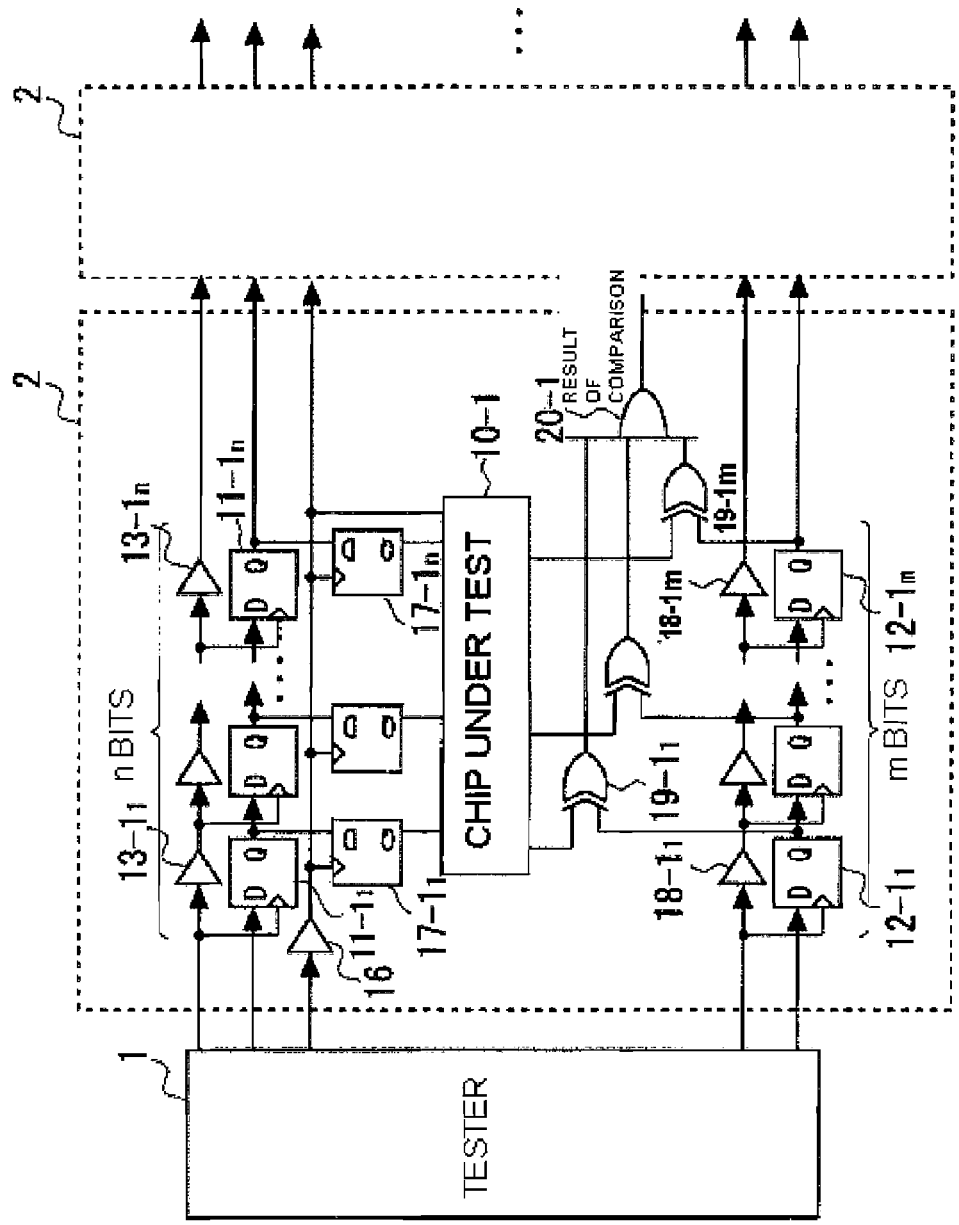
FIG. 10 is a circuit diagram showing a configuration of Example 5 of the present invention.

An Example 5 of the present invention is now described. FIG. 10 is a circuit diagram showing a configuration of a semiconductor device of Example 5 of the present invention and its setup for testing. The semiconductor device (semiconductor chip) 2 includes F/F $11\text{-}1_1$ to F/F $11\text{-}1_n$, F/F $17\text{-}1_1$ to F/F $17\text{-}1_n$ and F/F $12\text{-}1_1$ to F/F $12\text{-}1_m$, shown in FIG. 7, comparators $19\text{-}1_1$ to $19\text{-}1_m$, an OR circuit 20-1, clock buffers $13\text{-}1_1$ to $13\text{-}1_m$, clock buffers $18\text{-}1_1$ to $18\text{-}1_m$, and a chip under test 10-1, on one and the same chip. The OR circuit 20-1 takes an OR of the outputs of the m-number of the comparators $19\text{-}1_1$ to $19\text{-}1_m$. It is noted that the chip under test 10-1 within the semiconductor device 2 may be a chip mounted in a package of the semiconductor device or a circuit under test integrated into the semiconductor device. If, in this case, a processor, memories such as RAM or ROM, controllers or input/output circuits, are provided on-chip on the semiconductor device, the logic components, such as processor or controller, are termed 'chips under test' for convenience. The F/F $11\text{-}1_1$ to F/F $11\text{-}1_n$, F/F $17\text{-}1_1$ to F/F $17\text{-}1_n$, F/F $12\text{-}1_1$ to F/F $12\text{-}1_m$, clock buffers $13\text{-}1_1$ to $13\text{-}1_n$, clock buffer 16, clock buffers $18\text{-}1_1$ to $18\text{-}1_n$, comparators $19\text{-}1_1$ to $19\text{-}1_m$ and the OR circuit 20-1 are integrated on the same semiconductor chip 2 as the chip under test 10-1.

With the present Example, the semiconductor device 2 may be tested by simply supplying a data pattern of serial bits, an expected value pattern, a clock signal and a frequency divided clock signal thereto from the tester 1. During the next clock cycle, a data pattern and the expected value pattern are supplied to the next stage semiconductor device 2. That is, a plurality of semiconductor devices 2 may be tested by a simplified arrangement in which only the initial stage semiconductor device 2 out of a plurality of cascade-connected semiconductor devices 2 is connected to the tester 1.

Figure 11:
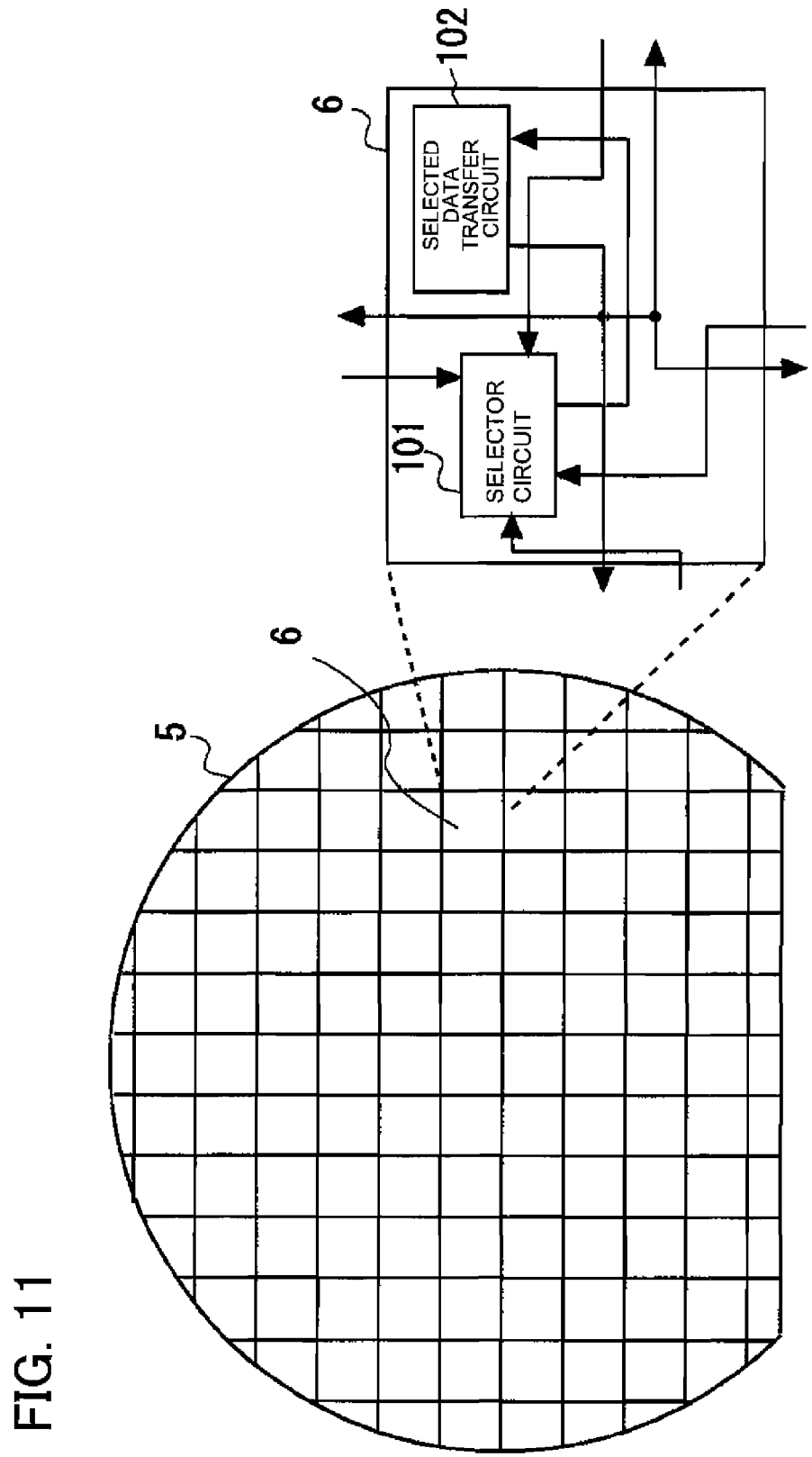
FIG. 11 is a schematic view for illustrating Example 6 of the present invention.

An Example 6 of the present invention is now described. FIG. 11 shows a configuration of the present Example 6, and specifically shows a wafer prior to a dicing step and the configuration of a die (chip) of the present invention. It should be noted that the die (chip) 6 at the end of the wafer 5 may not be in operation. Depending on a particular type of the chip, a sorting out transmit circuit may not be in operation. For this reason, electrical interconnection is set from a given chip 6 on the wafer 5 to neighboring chips in directions perpendicular to the four sides of the chip 6 of the wafer astride the four scribing lines. The chip 6 receives a set of signals (data pattern, clock signal and expected value pattern) from one selected direction out of the four directions. The chip 6 then outputs the so input signal set (data pattern, clock signal and expected value pattern) in all of the four directions.

That is, the chip 6 on the wafer 5 includes a selector circuit 101 and a selected data transfer circuit 102. The selector circuit 101 selects one of inputs of the four directions to select one of the four directions as an output. The selected data transfer circuit 102 receives the signal set (data pattern, clock signal and expected value pattern) as selected by and received from the selector circuit 101 to transfer the so received signal set to the chip under test as well as to output the signal set (data pattern, clock signal and expected value pattern). The signal set output from the selected data transfer circuit 102 is output to the signal lines of the four directions of the chip 6 and supplied to the selector circuit 101 of the neighboring chip. It is noted that the data pattern and the expected value pattern are serially transferred, while being converted within the semiconductor device into parallel bit data based on the frequency divided clock signal.

Figure 12:
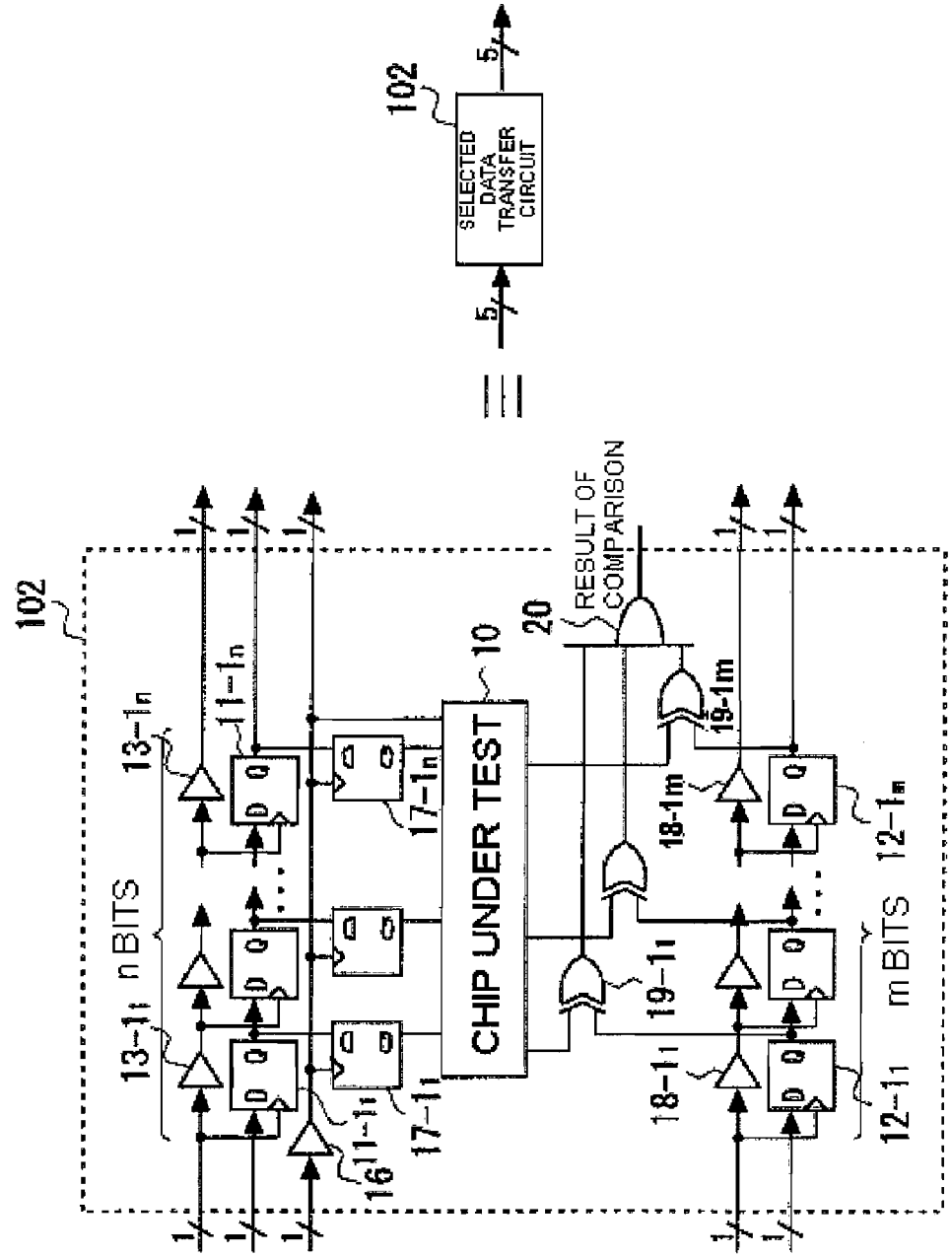
FIG. 12 is a circuit diagram showing a configuration of the Example 6 of the present invention.

The selected data transfer circuit 102 of FIG. 11, also shown in FIG. 12, is a circuit described in connection with Example 5 of FIG. 10. That is, the selected data transfer circuit 102 includes F/F $11\text{-}1_1$ to F/F $11\text{-}1_n$, F/F $17\text{-}1_1$ to F/F $17\text{-}1_n$, F/F $12\text{-}1_1$ to F/F $12\text{-}1_m$, clock buffers $13\text{-}1_1$ to $13\text{-}1_n$, a clock buffer 16, clock buffers $18\text{-}1_1$ to $18\text{-}1_n$, comparators $19\text{-}1_1$ to $19\text{-}1_m$, an OR circuit 20-1 and a chip under test 10. These components are integrated, along with the selector circuit 101, on the chip 6 of FIG. 11.

In the selector circuit 101, the sequence of operations for selecting one of the four input data may be fixed or optionally set from outside, that is, may be programmable. It is possible for the selector circuit 101 to select one of four input data that has been changed first since the start of testing. It may occur that a given chip is close to an end of the wafer 5 such that there are less than four neighboring chips for the given chip, there being only neighboring chips in two or three directions. In such case, the sequence of cascade connection of the chip 6 may be set in the selector circuit 101 and the entire chips on the wafer may then be connected in a unicursal manner.

The data pattern, expected value pattern, clock signal and the frequency divided clock signal may be afforded to one chip 6 on the wafer 5 via a tester and a wafer prober and thereby sequentially transferred to the chips on the wafer which are connected in a unicursal manner. By so doing, the data pattern and the expected value pattern may be distributed to test the entire chips 6 on the wafer. It is of course possible to divide the entire surface of the wafer 5 into several sections to test a plurality of chips 6 in a given section.

An interconnection of a signal from the selected data transfer circuits 102 of the chips located on the four sides of the chip 6 on the wafer 5 of FIG. 11 to the selector circuit 101 of the chip 6, and an interconnection of an output signal of the selected data transfer circuit 102, which is output to the selector circuits 101 of the neighboring chips on the four sides, are severed by, for example, a wafer dicing step.

Figure 13:
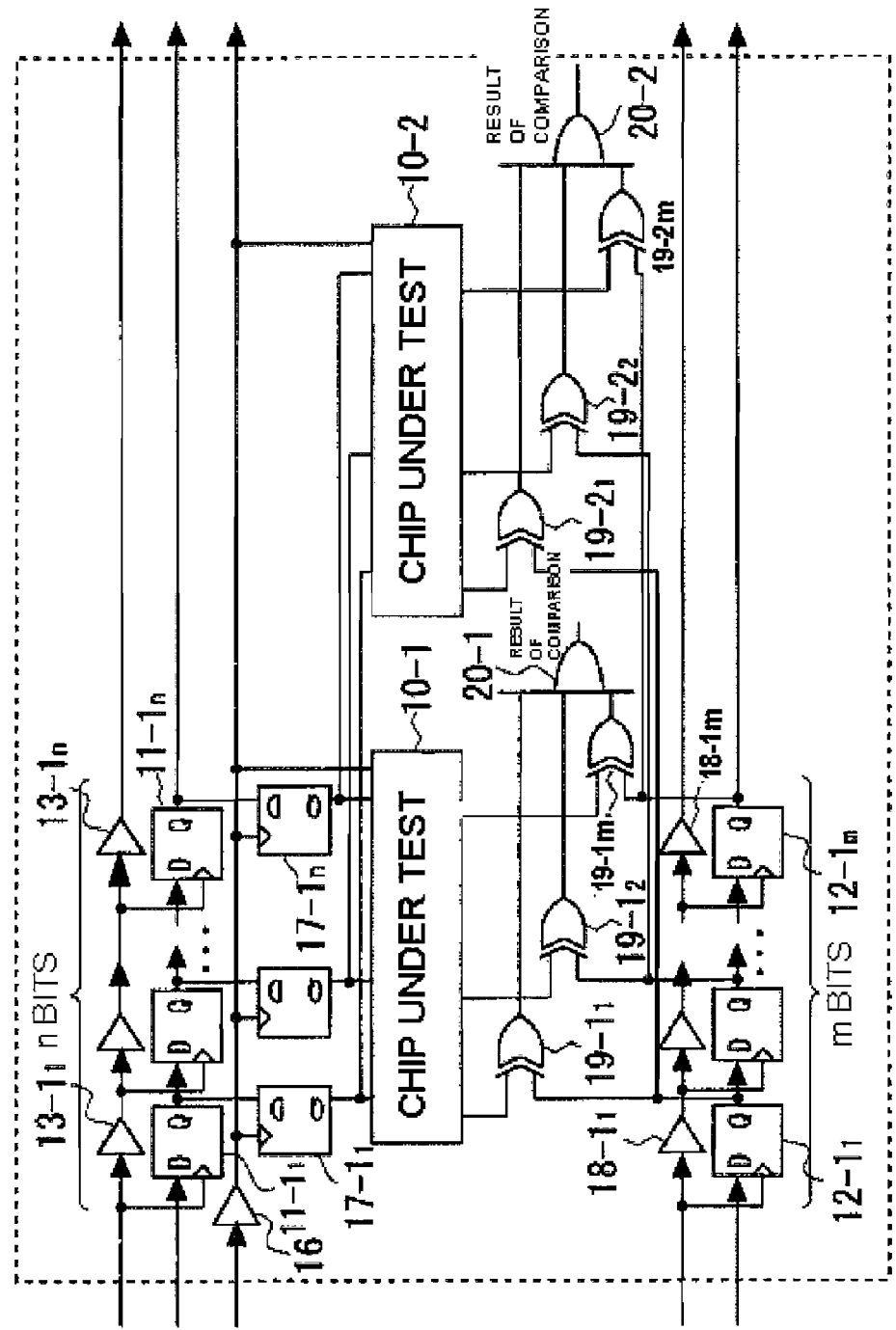
FIG. 13 is a circuit diagram showing a configuration of Example 7 of the present invention.

An Example 7 of the present invention is now described with reference to FIG. 13 illustrating its configuration. In the present Example, a plurality of chips under test are tested simultaneously. Referring to FIG. 13, showing the present Example, two chips under test are tested simultaneously per each pipelining stage. That is, data converted into parallel data by the F/F $11\text{-}1_1$ to F/F $11\text{-}1_n$ and F/F $17\text{-}1_1$ to F/F $17\text{-}1_n$ are distributed and supplied to two chips under test 10-1 and 10-2. Outputs of the F/F $12\text{-}1_1$ to F/F $12\text{-}1_m$, sampling an m-number of expected value patterns, serially transferred from the tester 1, are compared with the output of the chip under test 10-1 by the comparators $19\text{-}1_1$ to $19\text{-}1_m$, while being compared with the output of the chip under test 10-2 by the comparators $19\text{-}2_1$ to $19\text{-}2_m$. Outputs of the comparators $19\text{-}1_1$ to $19\text{-}1_m$ are supplied to the OR-circuit 20-1, while outputs of the comparators $19\text{-}2_1$ to $19\text{-}2m$ are supplied to the OR-circuit 20-2. In each pipelining stage, a plurality of the chips under test are tested simultaneously.

Figure 14:
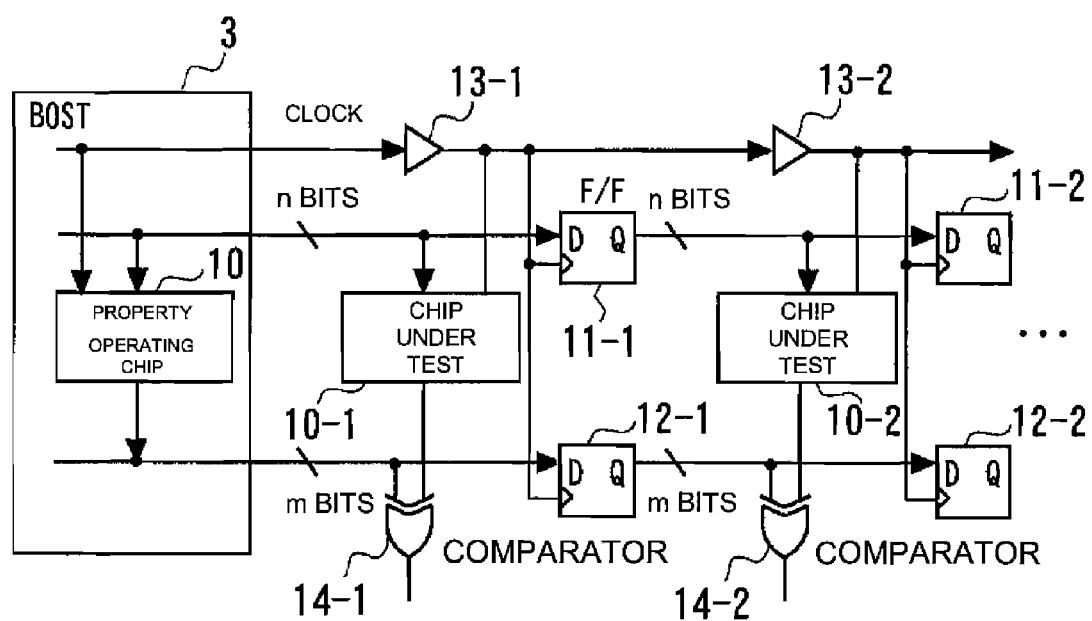
FIG. 14 is a circuit diagram showing a configuration of Example 8 of the present invention.

An Example 8 of the present invention is now described with reference to FIG. 14 illustrating its configuration. Referring to FIG. 14, the present Example includes a BOST (Built Out Self Test) device 3 including a properly operating chip (also termed as a known good device) 10. In BOST, a chip (properly operating chip 10) is mounted on the device and operated under real operating conditions as set by a user to carry out testing. In the present Example, the BOST device 3 is combined with the Example 3 explained with reference to FIG. 5. An n-bit data signal, including the control signal, and which is supplied to the properly operating chip 10, is taken out and connected to an input terminal of the data input terminal D of F/F 11-1. The clock signal, supplied to the properly operating chip 10, is taken out and connected to the input terminal of the clock buffer 13-1. An m-bit signal, output from the properly operating chip 10, is taken out and connected to the data input terminal D of the F/F 12-1 and to one input terminal of the comparator 14-1. An m-number each of F/Fs 12-1 and F/Fs 12-2 are provided in parallel in keeping with the n-bit width data signal. The comparators 14-1, 14-2 compare an m-bit output of the chip under test and the m-bit expected value pattern to check to see whether or not these coincide with each other.

A test pattern (n-bit parallel data) which is the same as the data signal supplied to the properly operating chip 10 is supplied to the chip under test 10-1. An output of the properly operating chip 10 is compared with an output of the chip under test 10-1 by the comparator 14-1 to check for pass/fail.

The data pattern, supplied to the chip under test 10-1, is sampled by F/F 11-1, in synchronization with the rising edge of the clock buffer 13-1, and the so sampled data pattern is output at the data output terminal Q. Thus, the data pattern, which is the same as the data pattern supplied to the chip under test 10-1 of the previous stage, is supplied by F/F 11-1 after a delay of one clock cycle. An output pattern of the chip under test 10-2 and an expected value pattern obtained on sampling the output of the properly operating chip 10 by FF 12-1 are compared with each other by the comparator 14-2 to perform pass/fail decision.

Heretofore, only one chip may be tested with a BOST at a time. With the present Example, a plurality of chips can be tested on a single BOST.

With the present Example, chips under test may be tested on a BT (Burn-in Test) equipment. In this case, the chip under test 10-1, chip under test 10-2, F/F 11-1, F/F 11-2, F/F 12-1, F/F 12-2, clock buffer 13-1, clock buffer 13-2, comparator 14-1 and the comparator 14-2 are mounted on a burn-in board, not shown. Outputs of the comparator 14-1 and the comparator 14-2 may be supplied to a burn-in tester, not shown.

With the present Example, the chips under test 10-1, 10-2 may be tested simply by supplying the power supply to the BOST device 3 and by causing the properly operating chip 10 to operate. It is thus unnecessary to generate a test pattern for testing the chip under test such that functional tests may be conducted under conditions matched to real use of the properly operating chip 10.

A test board, not shown, having the chips under test 10-1 and 10-2 mounted thereon, may also be provided with LEDs, not shown, which is turned on when outputs of the comparators 14-1, 14-2 indicate failure, to perform pass/fail screening.

Or, the BOST device 3 may be controlled using a power supply of a tester, not shown, and an input/output port (channel), and the results of comparison by the comparators 14-1, 14-2 may be supplied to a tester, not shown. As a modification, a data pattern may be applied from the tester, not shown, to the properly operating chip 10.

Figure 15A:
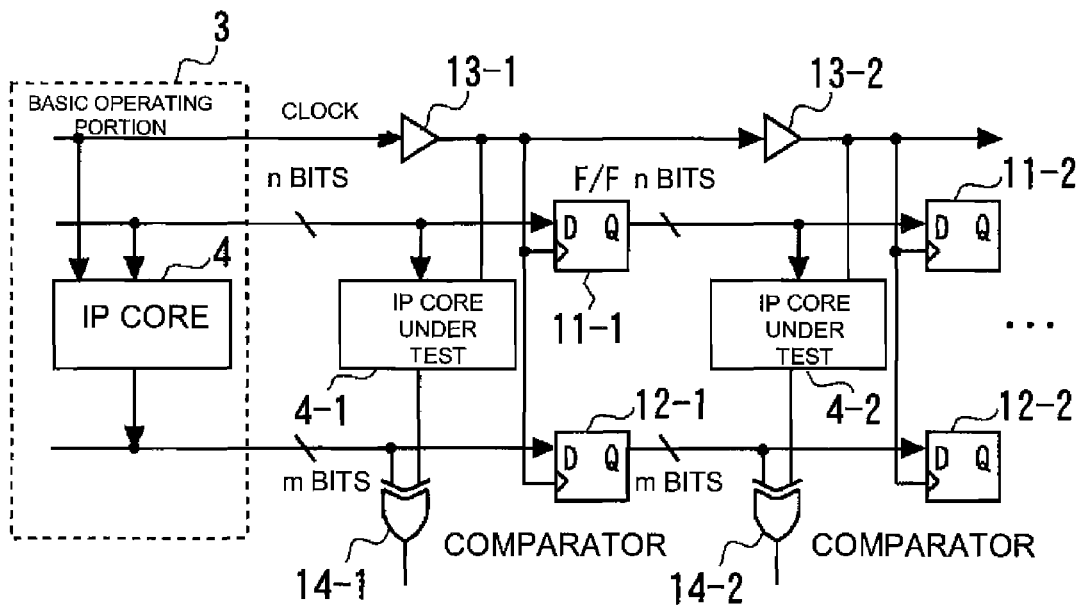
FIGS. 15A and 15B are a circuit diagram and a schematic view showing a configuration of Example 9 of the present invention.
Figure 15B:
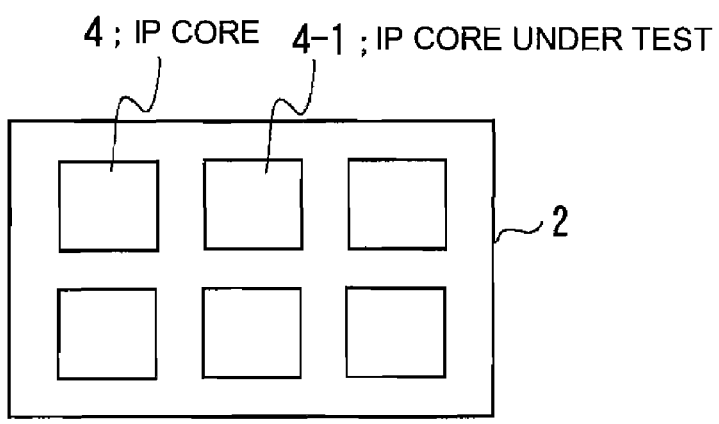

An Example 9 of the present invention is now described with reference to FIGS. 15A and 15B, showing its configuration. Referring to FIG. 15B, when a plurality of the same IP (Intellectual Property) cores are included in the semiconductor device (chip) 2, one such IP core 4 may be used to compare it to test results of an IP core under test 4-1 to detect its possible failure.

Referring to FIG. 15A, showing the present Example, the IP core 4 is combined with the configuration of Example 3 explained with reference to FIG. 5. The IP core under test takes the place of the chip under test of FIG. 5. An n-bit data pattern, supplied to the IP core 4 of the basic operating portion 3, is supplied to the IP core 4-1, and respective m-bit outputs are compared with each other by the comparator 14-1 to check for pass/fail. The data pattern, supplied to the IP core 4-1, is sampled by the F/F 11-1, in synchronization with the rising edge of the clock buffer 13-1, and the so sampled output is delivered at the data output terminal Q. Thus, the data pattern, which is the same as that supplied to the IP core 4-1, is supplied to the IP core 4-2, after a delay of one clock cycle caused by the F/F 11-1. The output pattern of the IP core 4-2 is compared by the comparator 14-2 to the pattern sampled by the F/F 12-1 to check for pass/fail. Outputs of the comparators 14-1, 14-2 and so forth may be directly output to outside, or compressed to one bit and output in this compressed state to outside as the pass/fail information.

The data pattern, supplied to the IP core 4, may be supplied to the IP core 4-1 as the power is on to cause the semiconductor chip 2 to operate.

Or, a data pattern may be supplied from outside to the IP core 4 of the basic operating portion to deliver the result of comparison at the comparators 14-1 and 14-2 to the tester, not shown.

Suppose that, in a semiconductor device having a plurality of IP cores of the same configuration, these IP cores are directly tested in parallel with the configuration shown in FIG. 16, as shown in FIG. 15B. It is noted that an IP core is to take the place of the chip under test of FIG. 16. In such case, it may be impossible to test the total of the IP cores in parallel due to restrictions imposed on the number of input/output ports (channels) of the tester. In such case, the multiple IP cores are separated into groups each composed of a preset number of the IP cores, and are tested in parallel on the group basis. For example, if the six IP cores are separated into three groups, each composed of two IP cores, and these three groups are tested in parallel. In such case, the test time is thrice that of the case of parallel testing of six IP cores. That is, the test time increases.

Conversely, with the present Example, the number of input/output ports of the tester corresponding to the number of the single IP core 4 suffices. It is thus possible to suppress the volume of tester resources from increasing to provide for a shorter test time, since a plurality of IP cores may be tested in parallel, thus testifying to extremely high practical usefulness of the present Example.

Figure 17:
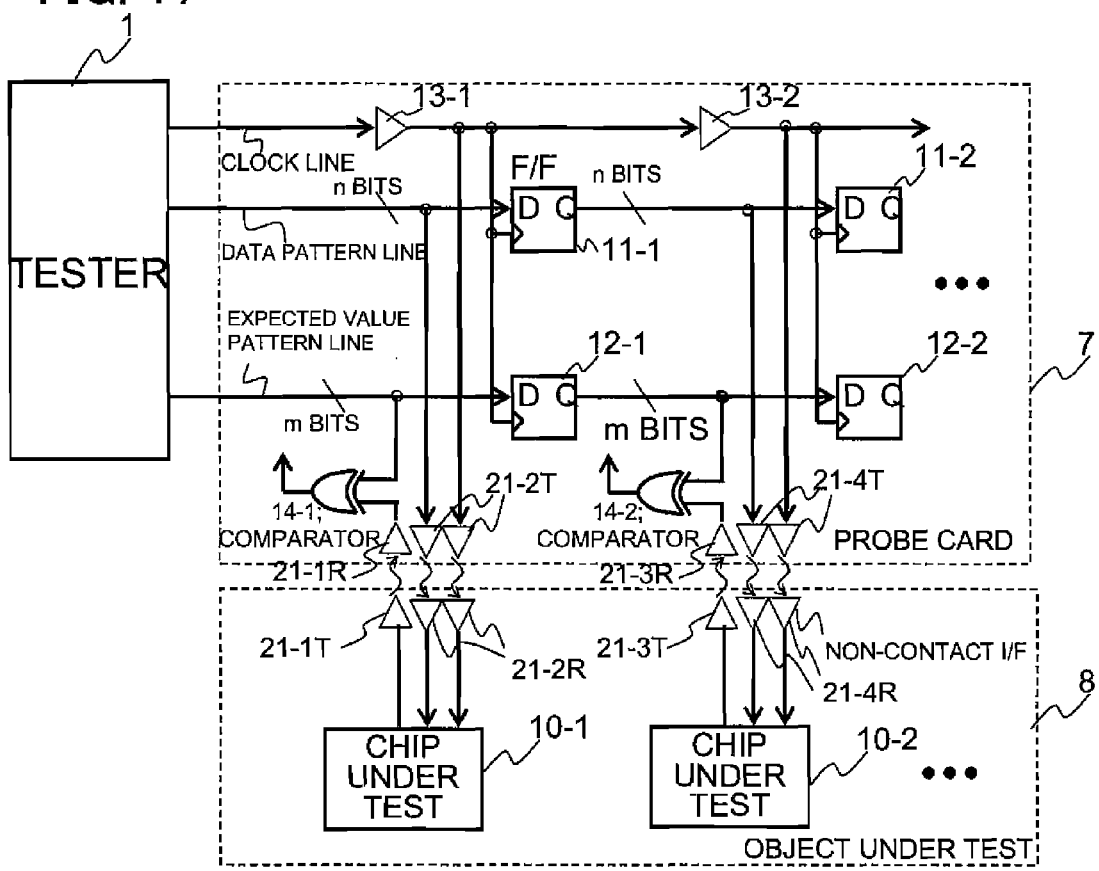
FIG. 17 is a circuit diagram showing a configuration of Example 10 of the present invention.

FIG. 17 shows a configuration of Example 10 of the present invention. Referring to FIG. 17, the Present Example uses a non-contact I/F (interface) (a pair of a transmit circuit 21-1T and a receive circuit 21-1R). In the above Example 3, a portion including multiple chips under test 10-1, 10-2 and so on, as an object under test 8, is separated from a portion that transfers test data from the tester 1 (probe card 7). The multiple chips under test may be the chips prior to dicing, that is, may be the multiple chips under test in a wafer state. The clock on a clock line and data on a data pattern line are delivered, via non-contact I/Fs (21-2T and 21-2R; 21-4T and 21-4R) to the relevant chips under test 10-1 and 10-2. Outputs of the chips under test (10-1 and 10-2) are delivered, via non-contact I/Fs (21-1T and 21-1R; 21-3T and 21-3R) to one input terminals of the relevant comparators (14-1 and 14-2)

provided on the side of the probe card 7. To the other input terminals of the comparators are delivered corresponding expected values on the expected value pattern line.

By the above configuration, a sole probe card may be used common for a plurality of the devices under test. Moreover, since the I/F is of the non-contact type, there is caused no mechanical wear, thus elongating the product life of the probe card.

Figure 18:
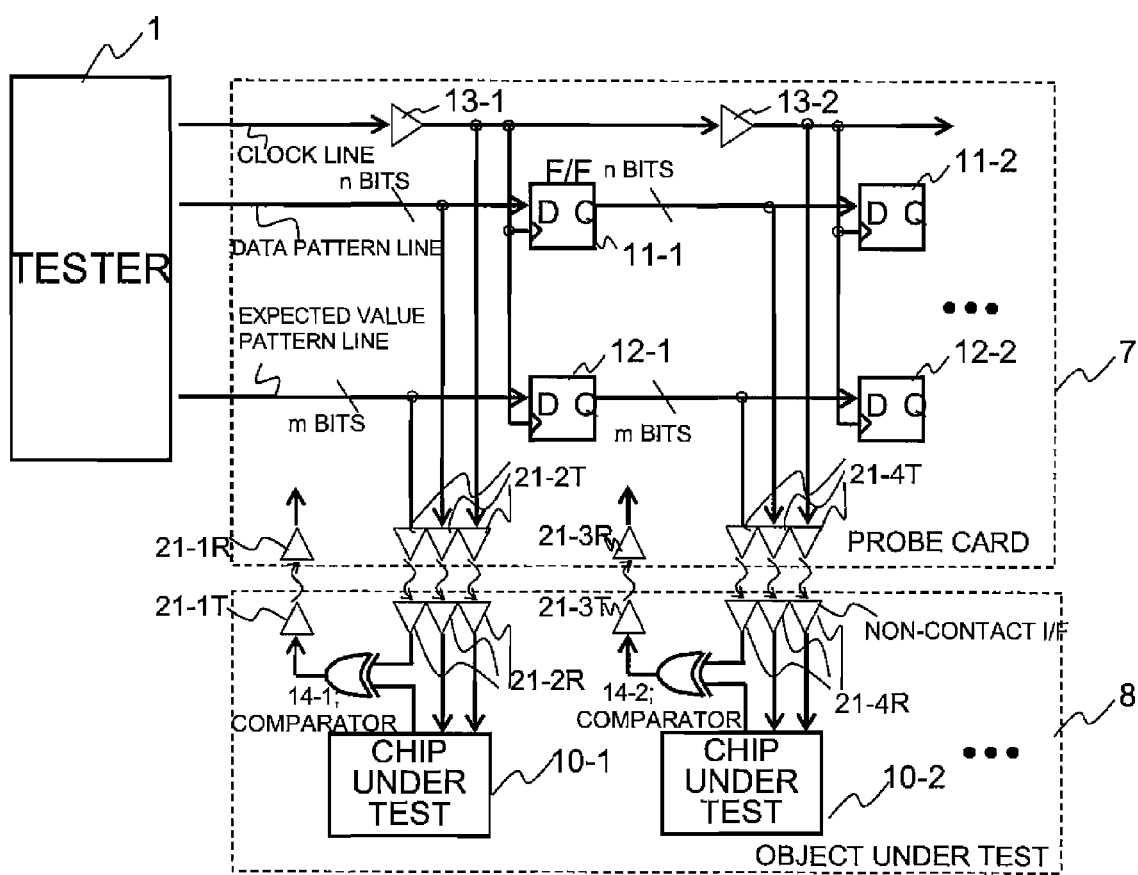
FIG. 18 is a circuit diagram showing a configuration of Example 11 of the present invention.

FIG. 18 shows the configuration of an Example 11 of the present invention. With the present Example, the expected value pattern is output from the probe card 7 simultaneously with the test data pattern to the object under test 8, and comparison is carried out on the side of the object under test 8. With the non-contact I/F, in general, the area or power consumption may be made smaller on the receiver circuit side. It should be noted that, with the present Example, the area taken up by the non-contact I/F within the object under test 8 or power consumption may be smaller. Referring to FIG. 18, the result of comparison of the output of the chip under test with the expected value pattern is transferred to the probe card 7 using the non-contact I/F. The clock on the clock line, data on the data pattern line and the expected value on the expected value pattern line are supplied to one input terminals of the corresponding comparators (14-1 and 14-2) on the chip under test side via the non-contact I/Fs (21-2T and 21-2R; 21-4T and 21-4R). Outputs of the chips under test (10-1 and 10-2) are supplied to the other input terminals of the corresponding comparators (14-1 and 14-2). The results of comparison by the comparators (14-1 and 14-2) are transferred to the side of the probe card 7 using the non-contact I/Fs (21-1T and 21-1R; 21-3T and 21-3R).

It is also possible to provide a means for holding the result of comparison within the object under test 8 to hold the result of comparison within the object under test 8. In this case, interfacing by the non-contact I/F may be only in the sole direction from the probe card 7 to the object under test 8.

In the above-described Examples 10 and 11, the non-contact I/F means a data communication interface between two points having no mechanical connection to the non-contact I/F. In a circuit shown in FIG. 4 of Non-Patent Document 1, data communication is e.g. by electromagnetic coupling. The non-contact I/F may also be by capacitive coupling;
optical communication; or
wireless communication.

If, in case of data communication by non-contact I/F by electromagnetic coupling, the area of inductance within the transmit circuits (21-1T to 21-4T) and are enlarged and the area of inductance within the receive circuits (21-1R to 21-4R) are reduced, the area of the receive circuit may be reduced with the coupling coefficient remaining the same.

In similar manner, if the area of inductance within the transmit circuits and that within the receive circuits are reduced and enlarged, respectively, the area of the transmit circuit may be reduced with the coupling coefficient remaining the same. It should be noted that, since the object under test 8 is a wafer, as a product, the area occupied by the receive circuit or the transmit circuit, mounted on the wafer (device under test 8) may be less than that on the probe card 7 by changing the area of the inductance depending on whether the non-contact I/F is for transmission or reception. This should lower product costs.

The non-contact I/F may be provided with
(a) a mechanism for compressing or expanding data amount;
(b) a mechanism for correcting errors; and
(c) a mechanism for reducing the number of bits at the non-contact data exchanging portion compared with the number of input/output bits of the non-contact I/F. Such reduction in the number of bits at the non-contact data exchanging portion is made possible by introducing a parallel-to-serial circuit and a serial-to-parallel circuit on the output and input sides, respectively.

For accomplishing the object of simultaneously testing a plurality of chips under test, the non-contact I/F may be a contact I/F by a needle or a pogo-pin. The non-contact I/F may be combined with the contact I/F depending on the needed data rate. Alternatively, a non-contact I/F and a contact I/F may be integrated within the chip under test.

The particular exemplary embodiments or examples may be modified or adjusted within the gamut of the entire disclosure of the present invention, inclusive of claims, based on the fundamental technical concept of the invention. Further, variegated combinations or selection of elements disclosed herein may be made within the framework of the claims. That is, the present invention may encompass various modifications or corrections that may occur to those skilled in the art in accordance with the within the gamut of the entire disclosure of the present invention, inclusive of claim and the technical concept of the present invention.

What is claimed is:

1. A parallel test circuit comprising:
   a first transfer circuit that sequentially transfers a data pattern, supplied from a data pattern supply source, in response to a clock signal,
   the data pattern from the data pattern supply source being supplied to one of a plurality of chips under test,
   a data pattern from a corresponding stage of the first transfer circuit being sequentially supplied to each of the remaining ones of the chips under test;
   a second transfer circuit that sequentially transfers an output of the one chip under test, as an expected value pattern, in response to the clock signal; and
   a comparator circuit that is provided in association with each of the remaining chips under test and that compares output data of each of the remaining chips under test with the expected value pattern supplied from corresponding stages of the second transfer circuit to determine whether or not the output data coincides with the expected value pattern;
   a plurality of chips under test being allowed to be tested in parallel by the sole data pattern supply source,
   wherein as the one chip under test, there are provided a plurality of chips under test connected in parallel,
   a data pattern from the data pattern supply source and a clock signal from a clock supply source are supplied in parallel to each of the chips under test connected in parallel, and
   the parallel test circuit includes a compare and select circuit that receives outputs of the chips under test connected in parallel and that gives a majority decision on the outputs to select output data,
   an output of the compare and select circuit being transferred as the expected value pattern to the second transfer circuit.

2. The parallel test circuit according to claim 1, wherein an output of the compare and select circuit is supplied to the test equipment and compared with an expected value pattern by a comparator in the test equipment.

3. A parallel test circuit comprising:
   a first transfer circuit that sequentially transfers a data pattern, supplied from a data pattern supply source, in response to a clock signal,
   the data pattern from the data pattern supply source being supplied to one of a plurality of chips under test, a data pattern from a corresponding stage of the first transfer circuit being sequentially supplied to each of the remaining ones of the chips under test;

a second transfer circuit that sequentially transfers an expected value pattern from an expected value pattern supply source, in response to the clock signal;

a comparator that compares output data of the one chip under test with the expected value pattern from the expected value pattern supply source to determine whether or not the output data of the one chip under test and the expected value pattern coincide with each other; and a comparator that is provided for each of the remaining chips under test and that compares output data of the each of the chips under test with an expected value pattern from a corresponding stage of the second transfer circuit to determine whether or not the output data and the expected value pattern coincide with each other, a plurality of chips under test being allowed to be tested in parallel by a sole data pattern supply source and a sole expected value pattern supply source, wherein the data pattern and the expected value pattern are serially transferred through the first and second transfer circuits, respectively, the parallel test circuit further comprising:

a circuit that converts the serial data pattern, serially transferred through the first transfer circuit, into a parallel data pattern of a preset bit width, the circuit being provided in association with each of the chips under test;

a circuit that converts a serial expected value pattern, serially transferred through the second transfer circuit, into a parallel expected value pattern of a preset bit width, the circuit being provided in association with each of the chips under test; and a set of a plurality of comparators and a logic circuit provided in association with each of the chips under test, each of the comparators comparing output data of each chip under test receiving the parallel data pattern with the corresponding parallel expected value pattern, bit-by-bit, to determine whether or not the output data and the parallel expected value pattern coincide with each other, bit-by-bit, the logic circuit outputting fail, in case at least one of the comparators indicates non-coincidence.

4. The parallel test circuit according to claim 3, further comprising:

a circuit that buffers an input clock signal to supply the signal buffered to the first and second transfer circuits, the circuit buffering a frequency divided input clock signal to convert the serial pattern and the serial expected value pattern into respective parallel data, and a clock distribution circuit that supplies clock to each of the chips under test.

5. A parallel test circuit comprising:

a first transfer circuit that sequentially transfers a data pattern, supplied from a data pattern supply source, in response to a clock signal, the data pattern from the data pattern supply source being supplied to one of the chips under test, a data pattern from a corresponding stage of the first transfer circuit being sequentially supplied to each of the remaining ones of the chips under test;

a second transfer circuit that sequentially transfers an expected value pattern from an expected value pattern supply source, in response to the clock signal;

a comparator that compares output data of the one chip under test with the expected value pattern from the expected value pattern supply source to determine whether or not the output data of the one chip under test and the expected value pattern coincide with each other; and a comparator that is provided for each of the remaining chips under test and that compares output data of the each of the chips under test with an expected value pattern from a corresponding stage of the second transfer circuit to determine whether or not the output data and the expected value pattern two coincide with each other, a plurality of chips under test being allowed to be tested in parallel by a sole data pattern supply source and a sole expected value pattern supply source, wherein the data pattern is serially transferred through the first transfer circuit and the expected value pattern is serially transferred through the second transfer circuit, the parallel test circuit further comprising:

a circuit that converts the serial data pattern, serially transferred through the first transfer circuit, into a parallel data pattern of a preset bit width, the circuit being provided common to a preset plural number of the chips under test;

a circuit that converts a serial expected value pattern, serially transferred through the second transfer circuit, into a parallel expected value pattern of a preset bit width, the circuit being provided common to a preset plural number of the chips under test; and a set of a plurality of comparators and a logic circuit provided in association with each of the chips under test, each of the comparators comparing output data of each chip under test receiving the parallel data pattern with the corresponding parallel expected value pattern, bit-by-bit, to determine whether or not the output data and the parallel expected value pattern coincide with each other, bit-by-bit, the logic circuit outputting fail in case at least one of the comparators indicates non-coincidence.

6. A parallel test circuit comprising:

a plurality of semiconductor devices connected in cascade, each of the semiconductor devices including a first converter circuit that receives a serially input data pattern and outputs the data pattern serially and that converts the serially input data pattern into a parallel data pattern;

a second converter circuit that outputs a serially input expected value pattern serially and that converts the serially input expected value pattern into a parallel expected value pattern;

the input clock signal being buffered by a clock buffer and distributed to each clock supply destination;

the chips or circuits under test each inputting the parallel data pattern from the first converter circuit;

a plurality of comparators that compare output data of the chips or circuits under test and the parallel expected value pattern from the second converter circuit bit-by-bit to determine whether or not the output data and the expected value pattern coincide with each other bit-by-bit; and a logic circuit that outputs fail in case at least one of the comparators indicates non-coincidence, wherein an initial stage semiconductor device is supplied with a data pattern, expected value pattern and clock signal from a test equipment, and each of the second and the following semiconductor devices is supplied with the data pattern, expected value pattern and clock signal from each of the semiconductor devices preceding to each of the second and the following semiconductor devices.

7. A semiconductor device circuit comprising:
a first converter circuit that serially outputs a serially input data pattern and that converts the serially input data pattern into a parallel data pattern;
a second converter circuit that serially outputs a serially input expected value pattern and that converts the serially input expected value pattern into a parallel expected value pattern,
the input clock signal being buffered by a clock buffer and distributed to each clock supply destination,
chips or circuits under test each receiving a parallel data pattern from the first converter circuit;
a plurality of comparators that compare output data of the chip or circuit under test and a parallel expected value pattern from the second converter circuit bit-by-bit to determine whether or not the output data and the expected value pattern coincide with each other bit-by-bit; and
a logic circuit that outputs fail in case at least one of the comparators indicates non-coincidence.

8. A method for parallel testing of a plurality of chips under test, comprising:
receiving a data pattern to be supplied to the chips under test from a preceding stage and transferring the data pattern to a succeeding stage by a first transfer circuit;
receiving an expected value pattern of the chip under test from a preceding stage and transferring the expected value pattern to a downstream side stage by a second transfer circuit; and
comparing an output of each of the chips under test with a corresponding expected value pattern,
wherein the timing relation between the clock signal and the data pattern applied to the chips under test is equalized among the plurality of chips under test by a plurality stages of clock buffer stages that receive a clock signal from a clock supply source.

9. A test method comprising:
sequentially transferring a data pattern supplied from a data pattern supply source by a first transfer circuit, in response to a clock signal;
supplying the data pattern from the data pattern supply source to one of a plurality of chips under test, and sequentially supplying data patterns from corresponding stages of the first transfer circuit to remaining ones of the chips under test;
sequentially supplying an output of the one chip under test as an expected value pattern by a second transfer circuit, in response to the clock signal; and
comparing, for each of the remaining chips under test, output data of the chip under test and an expected value pattern from corresponding stage of the second transfer circuit to determine whether or not the output data of the chip under test and the expected value pattern coincide with each other,
a plurality of the chips under test being allowed to be tested in parallel using a sole data pattern supply source,
wherein as the one chip under test, there are provided a plurality of chips under test connected in parallel is provided to operate, the method comprising:
supplying a data pattern from the data pattern supply source and a clock signal from the clock supply source in parallel to a plurality of the chips under test connected in parallel; and
receiving outputs of the chips under test connected in parallel, giving a majority decision and delivering resulting output data as an expected value pattern to the second transfer circuit.

10. A test method for a semiconductor device in which one semiconductor device on a semiconductor wafer prior to a dicing step has a signal path that transfers a data pattern, an expected value pattern and a clock signal to one or more other semiconductor devices neighboring to the one semiconductor device with respect to at least one of one to four sides of the one semiconductor device; the method comprising:
selecting one signal path corresponding to one of one to four sides of the one semiconductor device and inputting a set of a data pattern, an expected value pattern and a clock signal from the signal path corresponding to the selected direction; and
comparing output data of the chip under test with an expected value pattern received, the output data being data obtained as a result of operation of the chip under test that has received a selected data pattern and a clock signal and outputting the data pattern, the clock signal and the expected value pattern to at least one of one to four sides of the neighboring semiconductor devices;
a data pattern, a clock signal and an expected value pattern being supplied to the one semiconductor device on the semiconductor wafer,
the data pattern, the clock signal and the expected value pattern being sequentially transferred from the semiconductor device or devices neighboring to the one semiconductor device to other peripheral semiconductor devices.

11. A parallel test circuit for testing a plurality of chips under test in parallel, comprising:
a first transfer circuit that receives a data pattern to be applied to the chips under test from a preceding stage and transfers the data pattern to a succeeding stage; and
a second transfer circuit that receives an expected value pattern from a preceding stage and transfers the expected value pattern received to the succeeding stage;
an output of the chip under test being compared with a corresponding expected value pattern by a comparator provided in association with the chip under test,
wherein the chips under tests and a transfer circuit section for transferring the data pattern are separated, and wherein
the data patterns from the transfer circuit section are supplied through a non-contact interface to the chips under test.

12. The parallel test circuit according to claim 11, wherein the chips under tests and the transfer circuit section for transferring the data pattern are separated;
the comparators that compare outputs of the chips under test with the expected value pattern are provided on the transfer circuit section, and
the comparators receive an output pattern of the chip under test via a non-contact interface.

13. A parallel test circuit for testing a plurality of chips under test in parallel, comprising:
a first transfer circuit that receives a data pattern to be applied to the chips under test from a preceding stage and transfers the data pattern to a succeeding stage; and
a second transfer circuit that receives an expected value pattern from a preceding stage and transfers the expected value pattern received to the succeeding stage;
an output of the chip under test being compared with a corresponding expected value pattern by a comparator provided in association with the chip under test, wherein the chips under test are separated from a transfer circuit section that transfers the data pattern and expected value pattern, the data pattern and expected value pattern are supplied via a non-contact interface to the chips under test, and a comparator section that compares an output of the chips under test with the expected value pattern is provided on a side where the chips under test are provided.

14. A method for parallel testing of a plurality of chips under test, comprising:

receiving a data pattern to be supplied to the chips under test from a preceding stage and transferring the data pattern to a succeeding stage by a first transfer circuit;

receiving an expected value pattern of the chip under test from a preceding stage and transferring the expected value pattern to a downstream side stag by a second transfer circuit; and comparing an output of each of the chips under test with a corresponding expected value pattern, wherein the chips under tests and a transfer circuit section that transfers the data pattern are separated, and wherein data patterns from the transfer circuit section are supplied through a non-contact interface to the chips under test.

15. The test method according to claim 14, wherein the chips under tests and a transfer circuit section that transfers the data pattern are separated, and wherein the comparator section provided on a side where the transfer circuit section is provided receives an output of the chip under test via a non-contact interface and compares the outputs to corresponding expected value patterns.

16. A parallel test circuit for testing N number of chips under test in parallel, where N is a preset integer not less than 2, comprising:

(N−1) stages of first registers;
(N−1) stages of second registers;
N stages of clock buffers; and
(N−1) stages of comparators, a first stage first register, receiving a data pattern output from a tester and responsive to a clock signal output from a first stage clock buffer, capturing and outputting the received data pattern, other stage first registers following the first stage first register, each receiving a data pattern output from a preceding stage first register and responsive to a clock signal output from a corresponding stage clock buffer, capturing and outputting the received data pattern, a first chip under test, receiving a data pattern from the tester, driven by a clock signal output from the first stage clock buffer and outputting an output to the tester and a first stage second register, the tester comparing the output from the first chip under test and an expected pattern to determine coincidence or non-coincidence therebetween, other chips under test each receiving a data pattern from a preceding stage first register and driven by a clock signal output from a corresponding stage clock buffer, the first stage second register receiving the output from the first chip under test and responsive to the clock signal output from the first stage clock buffer, capturing and outputting the received output as an expected pattern, other stages of second registers following the first stage second register, each receiving an output from a preceding stage second register and responsive to a clock signal output from a corresponding stage clock buffer, capturing and outputting the received output as an expected pattern, the (N−1) stages of comparators each receiving an output from a corresponding stage second register and an output from a succeeding stage of chip under test for comparison to determine coincidence or non-coincidence therebetween.

* * * * *